(12) United States Patent  
Godo

(10) Patent No.: US 7,918,567 B2  
(45) Date of Patent: Apr. 5, 2011

(54) LIGHT EMITTING DEVICE, MANUFACTURING METHOD FOR LIGHT EMITTING DEVICE, ILLUMINATION DEVICE USING LIGHT EMITTING DEVICE, AND PROJECTOR

(75) Inventor: Hirokazu Godo, Tokyo (JP)

(73) Assignee: Olympus Corporation, Tokyo (JP)

( * ) Notice: Subject to any disclaimer, the term of this patent is extended or adjusted under 35 U.S.C. 154(b) by 1036 days.

(21) Appl. No.: 11/629,323

(22) PCT Filed: Apr. 18, 2005

(86) PCT No.: PCT/JP2005/007388  
§ 371 (c)(1),  
(2), (4) Date: Dec. 8, 2006

(87) PCT Pub. No.: WO2005/122291  
PCT Pub. Date: Dec. 22, 2005

(65) Prior Publication Data  
US 2008/0030691 A1  Feb. 7, 2008

(30) Foreign Application Priority Data  
Jun. 10, 2004 (JP) ................. 2004-172457

(51) Int. Cl.  
G03B 21/28 (2006.01)  
F21V 7/04 (2006.01)  
(52) U.S. Cl. ............... 353/98; 362/551; 362/555  
(58) Field of Classification Search .......... 353/94, 353/98; 362/551, 555, 560; 385/901; 257/84, 257/88, 98, 99; 313/498, 512  
See application file for complete search history.

(56) References Cited

U.S. PATENT DOCUMENTS

| 3,756,688 | A | * | 9/1973 | Hudson et al. | ......... 385/43 |
| 6,476,551 | B1 | * | 11/2002 | Osawa et al. | ......... 313/506 |
| 6,905,214 | B2 | * | 6/2005 | Tani | ......... 353/56 |
| 7,078,732 | B1 | * | 7/2006 | Reeh et al. | ......... 257/98 |
| 2004/0184270 | A1 | * | 9/2004 | Halter | ......... 362/296 |

FOREIGN PATENT DOCUMENTS

| JP | 55-025307 U1 | 2/1980 |
| JP | 59-060615 U1 | 4/1984 |
| JP | 63-100855 U1 | 6/1988 |
| JP | 6-045656 A | 2/1994 |

(Continued)

Primary Examiner — Thanh X Luu  
Assistant Examiner — Danell L Owens  
(74) Attorney, Agent, or Firm — Volpe and Koenig P.C.; Ryan W. O'Donnell

(57) ABSTRACT

A light emitting device capable of achieving a small exit area, high directivity, and low loss; a manufacturing method thereof; an illumination device using this light emitting device; and a projector are provided. The light emitting devices 16 include an LED (light emitting element) 25, in the form of a rectangular light emitting element, having a light emitting part 23 for emitting illumination light; a substrate 26 for fixing the LED 25; a spacer 27 having a mirror surface 27A for reflecting the illumination light emitted from the LED 25; and a tapered rod (columnar light guide unit) 28 having a device-side incident surface (incident surface) 28A upon which illumination light is incident, tapered-rod side surfaces 28B serving as total reflection surfaces for totally reflecting illumination light received from the device-side incident surface 28A, and the device-side exit surface (exit surface) 28C which has a larger area than the device-side incident surface 28A and which emits the illumination light totally reflected at the tapered-rod side surfaces 28B.

24 Claims, 23 Drawing Sheets

FOREIGN PATENT DOCUMENTS

| | | |
|---|---|---|
| JP | 07-98416 A | 4/1995 |
| JP | 10-084137 A | 3/1998 |
| JP | 11-161197 U1 | 6/1999 |
| JP | 2000-294831 A | 10/2000 |
| JP | 2002-207139 A | 7/2002 |
| JP | 2003-011417 A | 1/2003 |
| JP | 2003-101077 A | 4/2003 |
| JP | 2003-330109 A | 11/2003 |
| JP | 2004-004237 A | 1/2004 |
| JP | 2004-093623 A | 3/2004 |

* cited by examiner

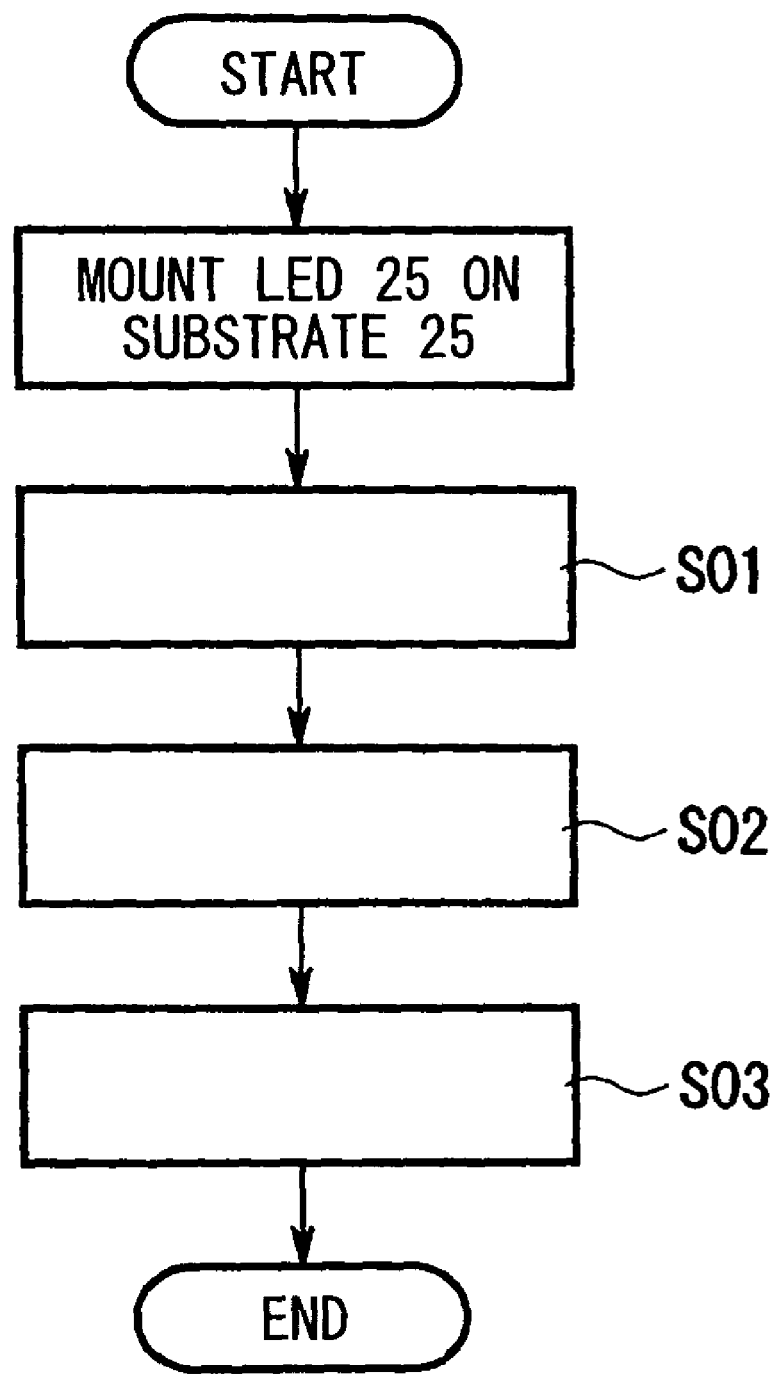

LIGHT EMITTING DEVICE, MANUFACTURING METHOD FOR LIGHT EMITTING DEVICE, ILLUMINATION DEVICE USING LIGHT EMITTING DEVICE, AND PROJECTOR

TECHNICAL FIELD

The present invention relates to a light emitting device, a manufacturing method for such a light emitting device, an illumination device using a light emitting device, and a projector including such an illumination device.

The present application claims the benefit of priority from Japanese Patent Application No. 2004-172457, filed Jun. 10, 2004, the contents of which are incorporated herein by reference.

BACKGROUND ART

In order to utilize a light emitting element which emits diffuse light, such as an LED, for the purpose of illumination, a technique for endowing light emitted from the light emitting element with directivity for efficient illumination is known. In one example shown in FIG. 25, a reflection surface 2 is disposed near a top surface 1A of a light emitting element 1 to guide light from the light emitting element 1 through a sealing resin (transparent member) 31 onto an incident surface 3 adjacent to a light guide unit.

In one specific example of such a technique that has been proposed, a light emitting element is covered by a reflection surface with differences in refractive index or a mirror reflection surface to efficiently supply light to an optical fiber (refer to, for example, Patent Documents 1 and 2).

Another example has also been proposed where a light source is covered with a reflection chamber having an opening so that light from the opening is emitted along a tapered light guide member to improve directivity (refer to, for example, Patent Document 3).

Patent Document 1: Japanese Unexamined Patent Application, Publication No. 2003-101077
Patent Document 2: Japanese Unexamined Patent Application, Publication No. Hei 10-84137
Patent Document 3: Japanese Unexamined Patent Application, Publication No. Hei 7-98416

DISCLOSURE OF INVENTION

An object of the present invention is to provide a light emitting device capable of achieving a small exit area, high directivity, and low loss; a manufacturing method thereof; an illumination device using this light emitting device; and a projector.

The present invention employs the following features.

A light emitting device according to a first aspect of the present invention includes at least one light emitting element having a light emitting part for emitting illumination light; a substrate to which the light emitting element is fixed; a spacer having a mirror surface for reflecting the illumination light emitted from the light emitting element; and at least one columnar light guide unit having an incident surface upon which the illumination light is incident, a total reflection surface for totally reflecting the illumination light coming from the incident surface, and an exit surface having an area larger than that of the incident surface, the exit surface emitting the illumination light totally reflected at the total reflection surface, wherein the spacer includes an indentation open at least at a top thereof or an opening, the light emitting element is positioned with respect to a bottom surface of the indentation or the opening and a bottom surface of the spacer, the mirror surface is formed on the indentation or an inner side surface of the opening, the area of the opening at the top surface of the spacer is larger than a bottom surface area of the indentation or the area of the opening at the bottom surface of the spacer, and the incident surface of the at least one columnar light guide unit is located in the indentation or on the spacer top surface at the opening.

A light emitting device according to a second aspect of the present invention includes at least one light emitting element having a light emitting part for emitting illumination light; a substrate to which the light emitting element is fixed; a spacer having a mirror surface for reflecting the illumination light emitted from the light emitting element; and at least one columnar light guide unit having an incident surface upon which the illumination light is incident, a total reflection surface for totally reflecting the illumination light coming from the incident surface, and an exit surface having an area larger than that of the incident surface, the exit surface emitting the illumination light totally reflected at the total reflection surface, wherein the spacer includes an indentation open at least at a top thereof or an opening, the mirror surface is formed on the indentation or an inner side surface of the opening, the position of the mirror surface closest to a bottom surface of the spacer is substantially equal to the position of the light emitting unit closest to the substrate in a depth direction of the indentation or the opening from a spacer top surface, and the light emitting element is positioned with respect to the indentation bottom surface of the spacer or the bottom surface of the spacer, the area of the opening at the top surface of the spacer is larger than the bottom surface area of the indentation or the area of the opening at the bottom surface of the spacer, and the incident surface of the at least one columnar light guide unit is located in the indentation or on the spacer top surface at the opening.

In the light emitting device according to the present invention, the incident surface of the at least one columnar light guide unit and the spacer top surface may be located substantially at an identical position.

In the light emitting device according to the present invention, the incident surface of the at least one columnar light guide unit may be disposed in the indentation or the opening, an edge of the incident surface being in contact with the mirror surface.

In the light emitting device according to the present invention, the indentation or the opening may be filled with a transparent member having a refractive index smaller than that of the columnar light guide unit, and at least the light emitting unit of the light emitting element may be shielded from the air by the transparent member.

In the light emitting device according to the present invention, the light emitting element may be connected to the substrate with a bonding wire, and a distance from the bottom surface of the indentation or the bottom surface of the spacer to the incident surface of the columnar light guide unit may be substantially equal to a distance from the top surface of the substrate to a most distant position of the bonding wire.

In the light emitting device according to the present invention, an electrode may be disposed on a face of the light emitting element, the face being opposite the substrate. The electrode may be connected directly to the substrate, and a distance from the bottom surface of the indentation or the bottom surface of the spacer to the incident surface of the columnar light guide unit may be substantially equal to a distance from the top surface of the substrate to the top surface of the light emitting element.

In the light emitting device according to the present invention, an electrode may be disposed on the spacer, the light emitting element may be connected directly to the substrate via the electrode, and a distance from the bottom surface of the indentation or the bottom surface of the spacer to the incident surface of the columnar light guide unit may be larger than a distance from the top surface of the substrate to the electrode.

In the light emitting device according to the present invention, the condition $n1>n2 \geqq m1>m2$ may be satisfied, where m1 represents the area of the opening on the top surface of the spacer at the indentation or the opening, m2 represents the bottom surface area of the indentation or the area of the opening at the bottom surface of the spacer, n1 represents an area of the exit surface of the columnar light guide unit, and n2 represents an area of the incident surface of the columnar light guide unit.

In the light emitting device according to the present invention, the condition $n1>m1>n2>m2$ may be satisfied, where m1 represents the area of the opening on the top surface of the spacer at the indentation or the opening, m2 represents the bottom surface area of the indentation or the area of the opening at the bottom surface of the spacer, n1 represents an area of the exit surface of the columnar light guide unit, and n2 represents an area of the incident surface of the columnar light guide unit.

In the light emitting device according to the present invention, an inside dimension of the indentation or the opening enclosed by the mirror surface along a direction of the spacer top surface may become gradually larger from the spacer bottom surface towards the spacer top surface, an inside dimension of the columnar light guide unit enclosed by the total reflection surface along a direction of the incident surface may become gradually larger from the incident surface towards the exit surface.

In the light emitting device according to the present invention, the light emitting element may include two light emitting elements, one end of a bonding wire may be connected to each of the two light emitting elements, and the other end of the bonding wire may be connected to one pad provided on the substrate.

In the light emitting device according to the present invention, the pad may be provided between the two light emitting elements.

In the light emitting device according to the present invention, the columnar light guide unit may include two columnar light guide units, corresponding to the light emitting elements, respectively.

In the light emitting device according to the present invention, the columnar light guide unit may include one columnar light guide unit, corresponding to the two light emitting elements.

The light emitting device according to the present invention may include a rod holding unit formed integrally with the spacer to support the at least one columnar light guide unit.

In the light emitting device according to the present invention, the rod holding unit may maintain a constant distance between the exit surface of the at least one columnar light guide unit and the spacer top surface.

In the light emitting device according to the present invention, the rod holding unit may support the at least one columnar light guide unit by the exit surface.

In the light emitting device according to the present invention, the rod holding unit may include a heat radiator for dissipating heat generated by the light emitting element.

An illumination device according to the present invention includes a plurality of the light emitting devices according to the present invention, wherein the light emitting devices are disposed around a circle having a center thereof in an intersecting area of a certain size such that normals to the exit surfaces of the columnar light guide units intersect in the intersecting area.

An illumination device according to the present invention includes a plurality of the light emitting devices according to the present invention, wherein the light emitting devices are disposed around a circle having a center thereof in an intersecting area of a certain size such that normals to the exit surfaces of the columnar light guide units intersect in the intersecting area, the exit surfaces being adjacent to one another, and the two light emitting elements are disposed side by side in a direction perpendicular to the circumference.

A projector according to the present invention includes the illumination device according to the present invention; a spatial modulating element for modulating illumination light emitted by the illumination device according to input image information; and a projection optical unit for projecting the illumination light modulated by the spatial modulating element onto a screen.

A manufacturing method for the light emitting device according to the present invention is a manufacturing method for the light emitting device according to the present invention. The method includes a first step of positioning the bottom surface of the indentation of the spacer or the bottom surface of the spacer with respect to the substrate; a second step of positioning the incident surface of the at least one columnar light guide unit with respect to an open area of the spacer top surface; and a third step of filling the indentation enclosed by the incident surface or the opening enclosed by the substrate and the incident surface with a transparent member having a refractive index smaller than that of the columnar light guide unit such that no air space remains on the incident surface and the transparent member does not adhere to a side face functioning as the total reflection surface of the columnar light guide unit.

A manufacturing method for the light emitting device according to the present invention is a manufacturing method for the light emitting device according to the present invention. The method includes a first step of positioning the bottom surface of the indentation of the spacer or the bottom surface of the spacer with respect to the substrate; a second step of filling the indentation or the opening having a bottom surface thereof enclosed by the substrate with a transparent member having a refractive index smaller than that of the columnar light guide unit; and a third step of moving the incident surface of the at least one columnar light guide unit to an open area of the spacer top surface for positioning such that no air space remains on the incident surface and the transparent member does not adhere to a side face functioning as the total reflection surface of the columnar light guide unit.

According to the present invention, an exit area of illumination light from the light emitting element can be maintained small to improve directivity, and loss at this time can be reduced. Therefore, a high-efficiency light emitting device, an illumination device including such a high-efficiency light emitting device, and a projector can be provided.

BRIEF DESCRIPTION OF DRAWINGS

FIG. 4 is a flowchart illustrating a manufacturing method for the light emitting device according to the first embodiment of the present invention.

EXPLANATION OF REFERENCE SIGNS

Figure 1:
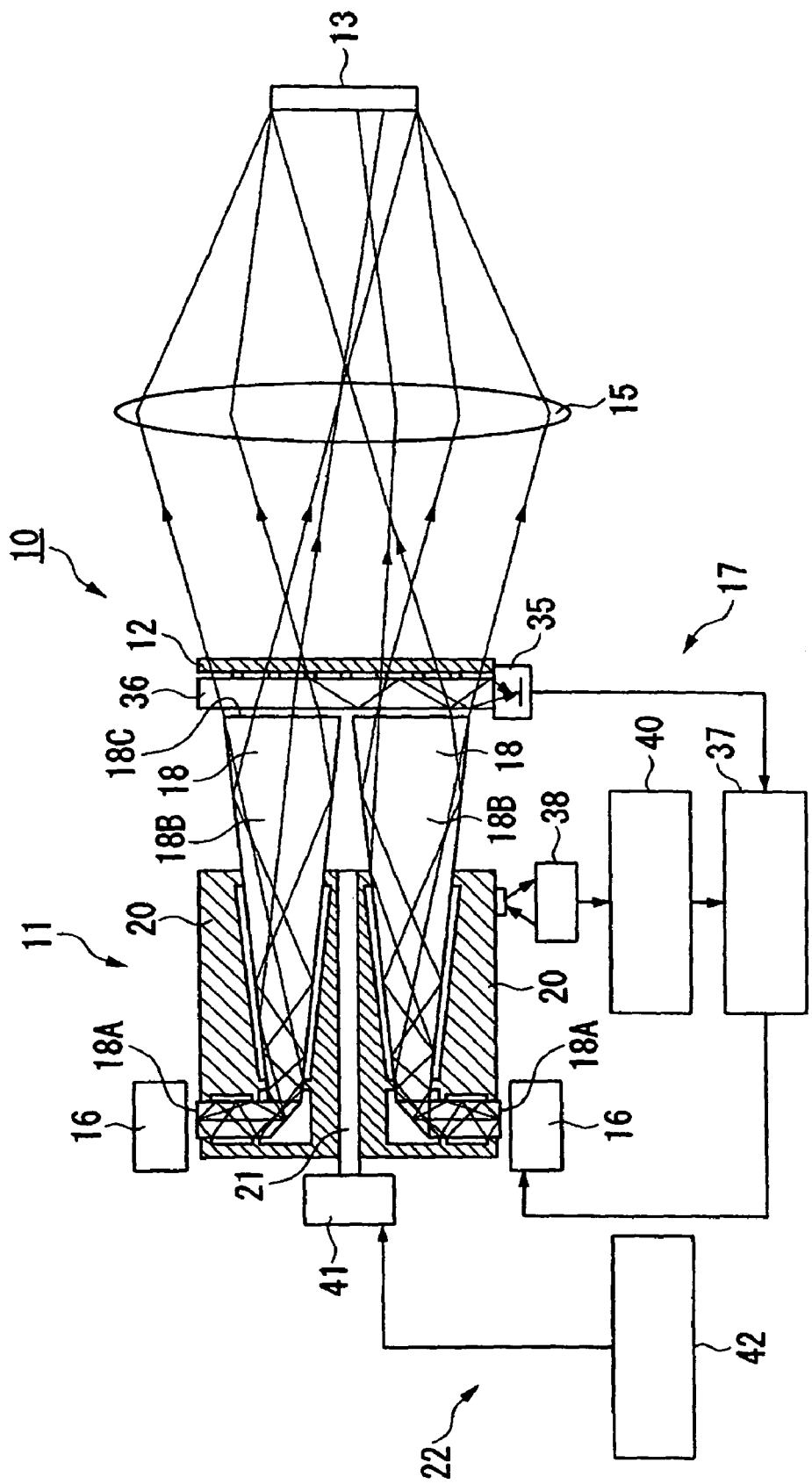
FIG. 1 illustrates a main part of the structure of a projector and an illumination device according to a first embodiment of the present invention.

10: projector
11, 78: illumination device
16, 50, 55, 60, 65, 70, 80, 85, 90, 120: light emitting device
17: light-emitting-device control unit
18: rectangular light guide rod member (light-collecting unit)
23: light emitting unit
25, 51, 68, 86, 92, 96, 98, 102: LED (light emitting element)
26, 72, 93: substrate
27, 56, 61, 66, 75, 91, 103, 101: spacer
27A, 56A, 61A, 75A, 91A: mirror surface
28, 71, 87, 110, 116: tapered rod (columnar light guide unit)
28A, 71A, 87A, 110A, 116A: device-side incident surface (incident surface)
28B, 71B: tapered-rod side surface (total reflection surface)
28C, 71C, 110C: device-side exit surface (exit surface)
30, 79, 94, 112: opening
31: sealing resin (transparent member)
52, 73: bonding wire
74: pad
76, 81, 117: rod holding unit
82: heat radiator

BEST MODE FOR CARRYING OUT THE INVENTION

Preferable embodiments according to the present invention will now be described with reference to the drawings.

A first embodiment according to the present invention will now be described with reference to FIGS. 1 to 5.

As shown in FIG. 1, a projector 10 according to this embodiment includes an illumination device 11 for emitting illumination light according to input image information; a beam-shape conversion diffuser 12 which is disposed near a device-side exit surface 18C (to be described later) of the illumination device 11 to convert the beam shape into a desired shape; a light modulating element 13 for modulating the illumination light that has passed through the beam-shape conversion diffuser 12 into a desired state; and an illumination lens 15 which, assuming the device-side exit surface 18C of the illumination device 11 as a virtual light source, defines a Koehler illumination optical system for forming an optical pupil on the light modulating element 13.

Figure 2:
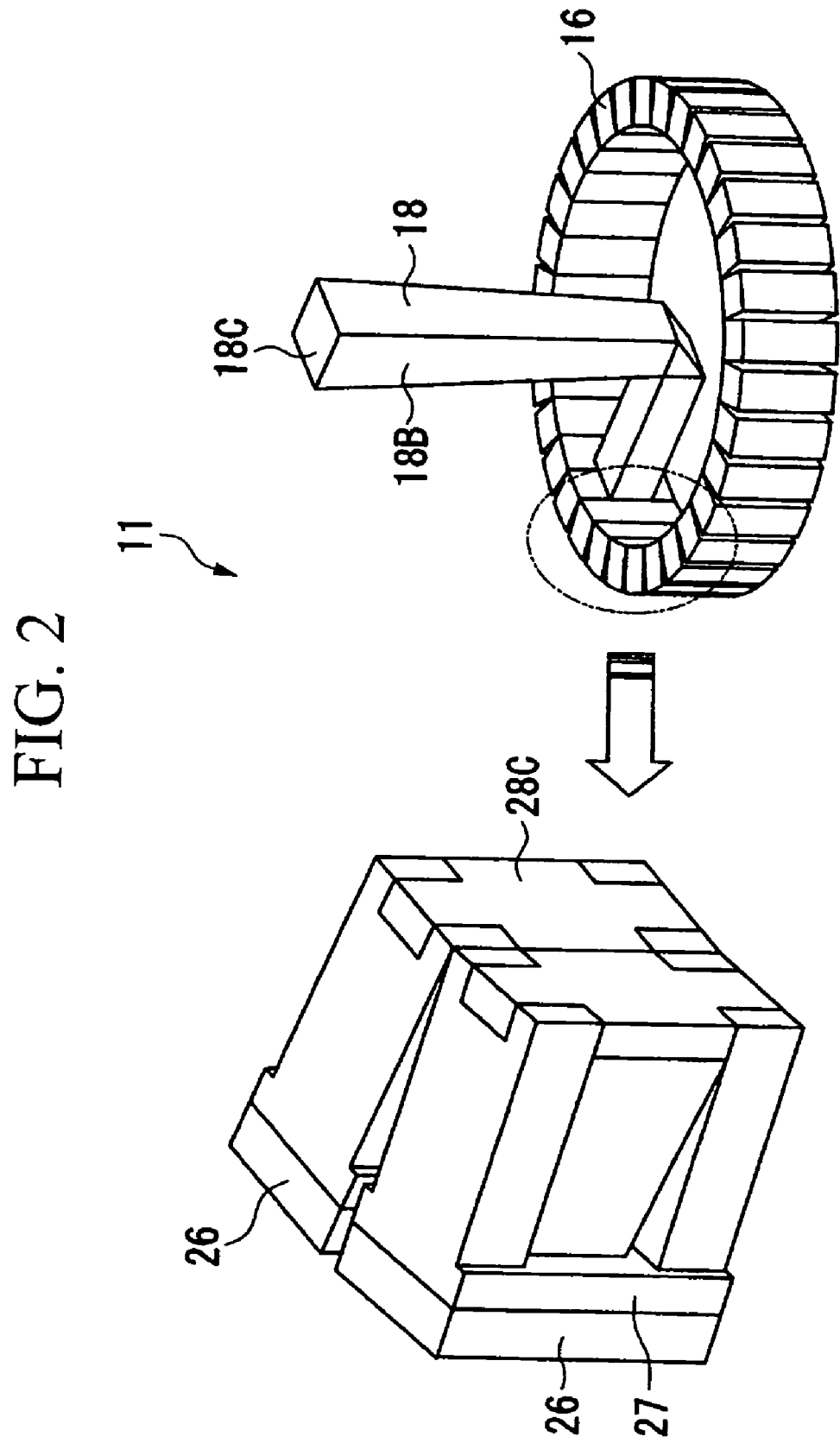
FIG. 2 is a perspective view depicting a main part of an illumination device according to the first embodiment of the present invention.

As shown in FIGS. 1 and 2, the illumination device 11 includes a plurality of light emitting devices 16 disposed around a circle having its center in an intersecting area such that the normals to device-side exit surfaces 28C (to be described later) intersect substantially at one point in that intersecting area; a light-emitting-device control unit 17 for time-sequentially illuminating each of the light emitting devices 16; two rectangular light guide rod members (light-collecting units) 18 each having a device-side incident surface 18A which receives illumination light from the light emitting devices 16, L-shaped total reflection surfaces 18B for collecting the received light while totally reflecting the received light, and a device-side exit surface 18C for emitting the collected light as illumination light; a rod holder 20 for supporting the rectangular light guide rod members 18; and a drive unit 22 for rotating the rod holder 20 about a rotary shaft 21 passing through the center position of the disposed light emitting devices 16.

Figure 3A:
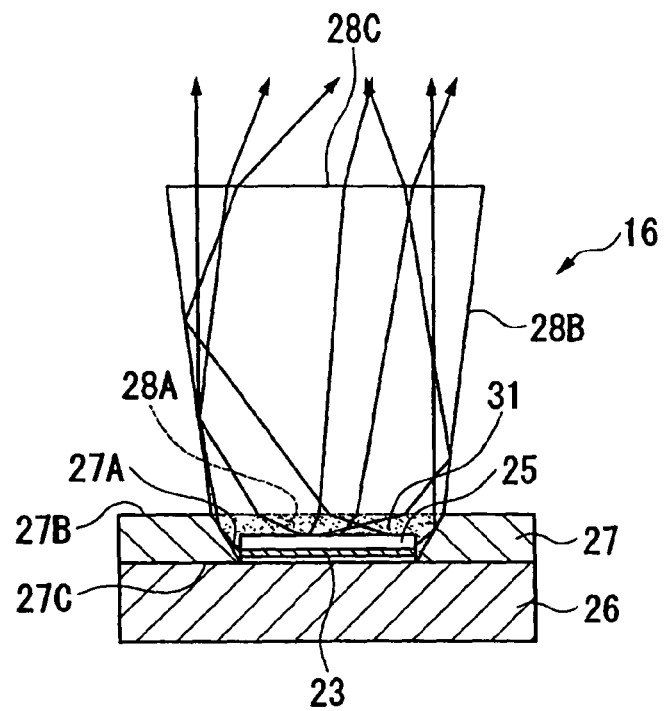
FIG. 3A is a cross-sectional view depicting a light emitting device according to the first embodiment of the present invention.
Figure 3B:
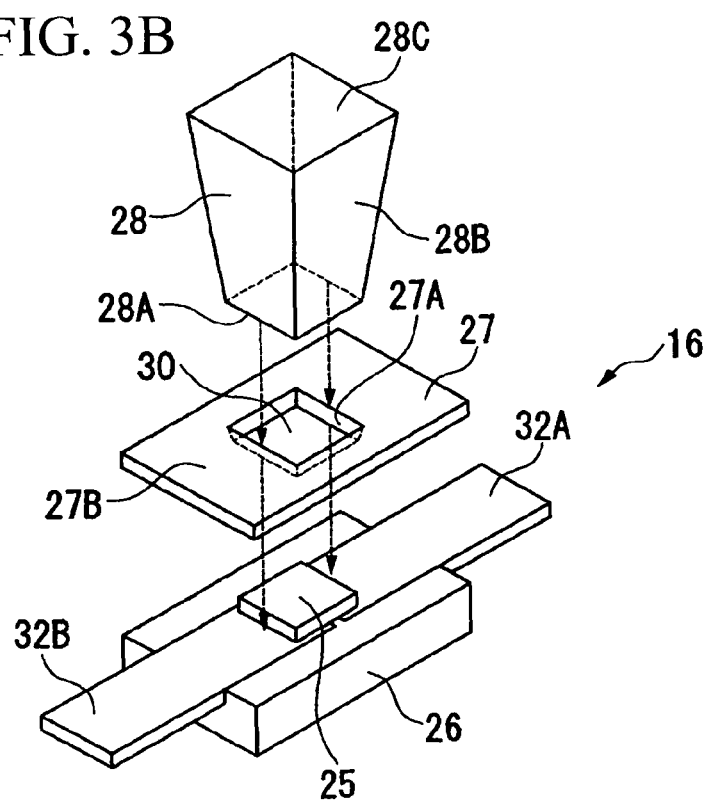
FIG. 3B is a perspective view depicting components to be assembled for the light emitting device according to the first embodiment of the present invention.

As shown in FIGS. 3A and 3B, the light emitting devices 16 include an LED 25, in the form of a rectangular light emitting element, having a light emitting part 23 for emitting illumination light; a substrate 26 for fixing the LED 25; a spacer 27 having a mirror surface 27A for reflecting the illumination light emitted from the LED 25; and a tapered rod (columnar light guide unit) 28 having a device-side incident surface (incident surface) 28A upon which illumination light is incident, tapered-rod side surfaces 28B serving as total reflection surfaces for totally reflecting illumination light received from the device-side incident surface 28A, and the device-side exit surface (exit surface) 28C which has a larger area than the device-side incident surface 28A and which emits the illumination light totally reflected at the tapered-rod side surfaces 28B.

The spacer 27 is formed in a rectangular solid and has a rectangular opening 30 formed at a top surface 27B thereof. In this opening 30, the LED 25 is positioned relative to the opening 30 and a bottom surface 27C of the spacer 27.

The mirror surface 27A is formed at an inner surface of the opening 30.

The area of the opening 30 is substantially equal to the area of the device-side incident surface 28A of the tapered rod 28, and the tapered rod 28 is disposed in the opening 30 such that the device-side incident surface 28A of the tapered rod 28 is aligned with the top surface 27B of the spacer 27.

The tapered rod 28 is formed in a rectangular solid, and the device-side incident surface 28A and the device-side exit surface 28C are formed in a rectangular shape.

The opening 30 of the spacer 27 is filled with a sealing resin (transparent member) 31 having lower refractive index than that of the tapered rod 28 to shield the light emitting unit 23 of the LED 25 from the air via the sealing resin 31.

The opening 30 of the spacer 27 is formed such that the area of the opening at the top surface 27B of the spacer 27 is larger than the area of the opening at the bottom surface 27C of the spacer 27. The area of the mirror surface 27A becomes gradually larger from the bottom surface 27C of the spacer 27 towards the top surface 27B of the spacer 27, and the areas of the tapered-rod side surfaces 28B of the tapered rod 28 become gradually larger from the device-side incident surface 28A towards the device-side exit surface 28C.

In short, $n1>n2=m1>m2$ holds for the opening 30, where m1 represents the area of the opening at the top surface 27B of the spacer 27, m2 represents the area of the opening 30 at the bottom surface 27C of the spacer 27, n1 represents the area of the device-side exit surface 28C of the tapered rod 28, and n2 represents the area of the device-side incident surface 28A of the tapered rod 28. Here, it is sufficient to satisfy the condition $n1>n2\geqq m1>m2$. In other words, if this condition is satisfied, light does not leak easily to outside the device-side incident surface 28A of the tapered rod 28 through the open area at the top surface 27B of the spacer 27. This achieves a light emitting device with a low level of loss.

Electrodes 32A and 32B reside between the bottom surface of the LED 25 and the substrate 26.

The rectangular light guide rod members 18 can be made to exhibit high efficiency by forming the device-side exit surface 28C of the light emitting device 16 in a rectangular shape and furthermore bringing the incident surface 18A near the device-side exit surface 28C.

These L-shaped rectangular light guide rod members 18 may be formed as a single unit or may be formed by bonding individual faces.

The beam-shape conversion diffuser 12 converts the angular intensity distribution of a beam emitted from the rectangular light guide rod members 18 into a positional intensity distribution in the illuminated area.

The light-emitting-device control unit 17 includes a light intensity monitor 35 for monitoring the amount of emitted light from the device-side exit surface 18C; a light guide plate 36 disposed near the device-side exit surface 18C to guide part of the emitted light onto the light intensity monitor 35; an LED drive circuit 37 for illuminating the LED 25 by performing feedback control of the drive current of the LED 25 such that an optimal amount of light is achieved according to an increase or decrease of the emitted light monitored in the light intensity monitor 35; a rotation sensor 38 disposed on the rod holder 20 to detect the rotational position of the rod holder 20; and an illumination timing control circuit 40 for controlling the illumination timing of the LED 25 based on the rotational position of the rod holder 20 detected by the rotation sensor 38.

The drive unit 22 includes a motor 41 connected to the rotary shaft 21 and a motor drive circuit 42 for driving the motor 41.

As shown in FIG. 4, a manufacturing method for this light emitting device 16 includes a first step of mounting the LED 25 on the substrate 26, followed by positioning the bottom surface 27C of the spacer 27 with respect to the substrate 26 (S01); a second step of positioning the device-side incident surface 28A of the tapered rod 28 with respect to the opening 30 at the top surface 27B of the spacer 27 (S02); and a third step of filling the opening 30 enclosed by the substrate 26 and the device-side incident surface 28A with the sealing resin 31 such that no air space remains on the device-side incident surface 28A and the sealing resin 31 does not adhere to the tapered-rod side surfaces 28B functioning as the total reflection surfaces of the tapered rod 28 (S03).

After a plurality of the light emitting devices 16 has been manufactured in this manner, the illumination device 11 is constructed and then assembled in the projector 10.

An operating procedure for and functions and advantages of the light emitting device 16, the illumination device 11, and the projector 10 according to this embodiment will now be described.

First, the illumination timing is sequentially switched among a plurality of the light emitting devices 16 using the illumination timing control circuit 40 for pulsed light emission. Simultaneously, to receive radiation from the device-side exit surface 28C, the drive unit 22 is driven to rotate the rod holder 20 such that the device-side incident surface 18A of the rectangular light guide rod member 18 faces the device-side exit surface 28C of the illuminated light emitting device 16.

Light emitted from the LED 25 is incident upon the device-side incident surface 28A through the sealing resin 31, either directly or after being reflected at the mirror surface 27A.

The incident illumination light reaches the device-side exit surface 28C while being totally reflected at the tapered-rod side surfaces 28B of the tapered rod 28 and exits outside.

The light coming through the device-side incident surface 18A of the rectangular light guide rod member 18 travels while being reflected in the rectangular light guide rod member 18 as in the tapered rod 28 and is emitted from the device-side exit surface 18C.

At this time, even if the rectangular light guide rod member 18 is displaced, the angular intensity distribution of the beam emitted from the rectangular light guide rod member 18 does not change. Therefore, the illumination light that has passed through the illumination lens 15 forms an optical pupil free of non-uniform illumination on the light modulating element 13.

Figure 5:
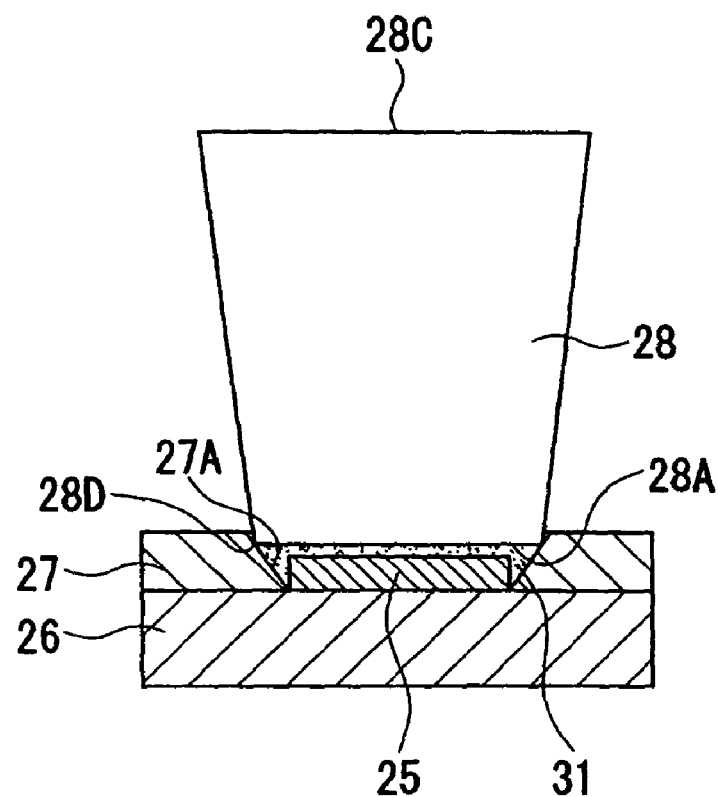
FIG. 5 is a cross-sectional view depicting another example of a light emitting device according to the first embodiment of the present invention.

As shown in FIG. 5, the device-side incident surface 28A of the tapered rod 28 may be disposed in an opening 30 such that an edge 28D of the device-side incident surface 28A is in contact with the mirror surface 27A. If this is the case, a gap is prevented from occurring at the boundary between the device-side incident surface 28A of the tapered rod 28 and the mirror surface 27A, irrespective of thermal expansion of or a manufacturing error in the resin forming the tapered rod 28 or the spacer 27, and light reflected at the mirror surface 27A can be guided into the tapered rod 28 more reliably through the device-side incident surface 28A.

According to this light emitting device 16, the area of the mirror surface 27A increases from the substrate 26 towards the tapered rod 28. When the LED 25 is positioned on the substrate 26 with respect to the opening 30 and the bottom surface 27C of the spacer 27, this structure of the mirror surface 27A allows illumination light emitted from the LED 25 to be guided onto the device-side incident surface 28A by efficiently reflecting the illumination light at the mirror surface 27A of the spacer 27 and more effectively preventing loss of light entering the tapered rod 28.

Furthermore, since there is no air space remaining between the sealing resin 31 and the tapered rod incident surface 28A, no light is reflected at the tapered rod incident surface 28A, that is, light can enter the tapered rod efficiently.

In addition, the mirror surface 27A of the spacer 27 and the tapered-rod side surfaces 28B of the tapered rod 28 are formed so as to spread from the incident end towards the exit end in a tapered manner such that the mirror surface 27A spreads at a higher rate than the tapered-rod side surfaces 28B. For this reason, it is possible to guide illumination light, which is emitted from the LED 25 at a relatively wide angle, onto the device-side exit surface 28C while changing the incident angle to achieve desired directivity. This accomplishes high directivity more appropriately.

Furthermore, according to the illumination device 11 provided with this light emitting device 16, illumination light with high directivity can be emitted from the device-side exit surfaces 28C of a plurality of the tapered rods 28 to collect a large amount of light in the intersecting area.

In addition, light that is collected in the rectangular light guide rod member 18 can be prevented from exhibiting non-uniform illumination by using the light-emitting-device control unit 17 to control fluctuations in the amount of illumination light from the LED 25 of the light emitting device 16 to within a certain range. This allows the illuminated area to be irradiated with a stable amount of light.

Furthermore, according to the projector 10 including this illumination device 11, a Koehler illumination optical system having the device-side exit surface 18C functioning as a virtual light source can be realized such that the amount of loss of light from the LED 25 is minimized to form an optical image with a uniform luminance distribution.

Figure 6A:
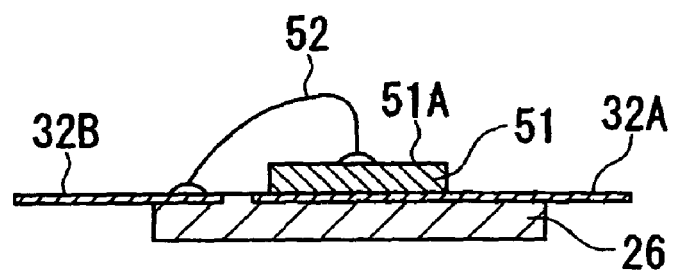
FIG. 6A is a cross-sectional view depicting a main part of a light emitting device according to a second embodiment of the present invention.
Figure 6B:
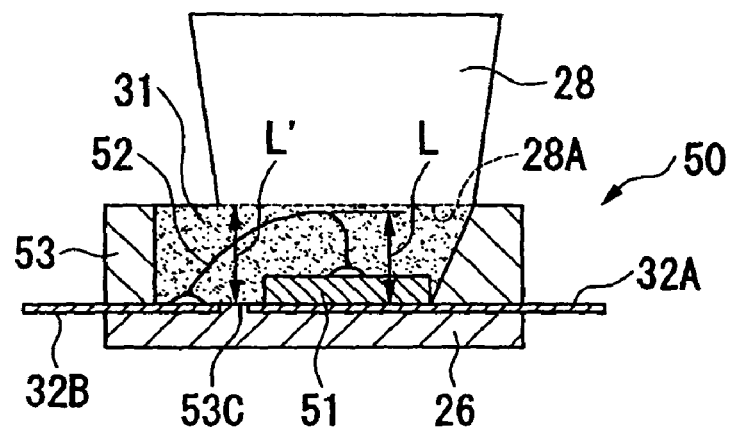
FIG. 6B is a cross-sectional view depicting a main part of the light emitting device according to the second embodiment of the present invention.
Figure 6C:
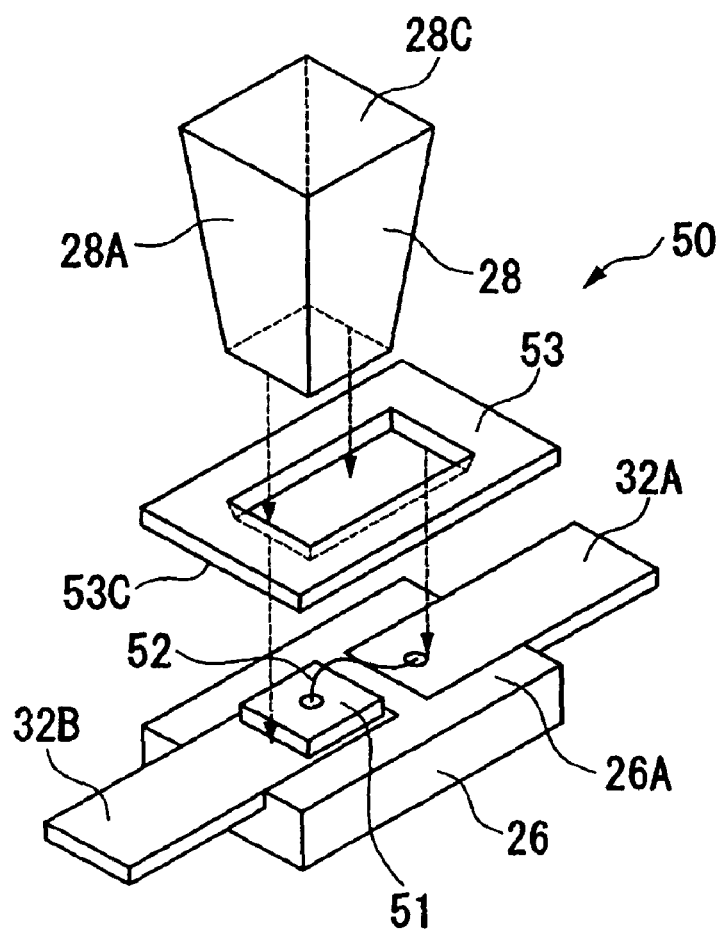
FIG. 6C is a perspective view depicting components to be assembled for the light emitting device according to the second embodiment of the present invention.

A second embodiment will now be described with reference to FIGS. 6A, 6B, and 6C.

The same components as those in the above-described first embodiment are denoted by the same reference numerals, and hence a description thereof will be omitted.

The second embodiment differs from the first embodiment in that, in a light emitting device 50 according to this embodiment, an LED 51 is connected to a substrate 26 at a top surface 51A of the LED 51 using a bonding wire 52, and a distance L' from a bottom surface 53C of a spacer 53 to a device-side incident surface 28A of a tapered rod 28 is substantially equal to a distance L from a top surface 26A of the substrate 26 to the maximum height (most distant position) of the bonding wire 52.

According to this light emitting device 50, when the LED 51 and the substrate 26 are to be connected with the bonding wire 52, functions and advantages similar to those in the above-described first embodiment can be achieved while a sufficient space for the sealing resin 31 and the bonding wire 52 is allocated.

Figure 7A:
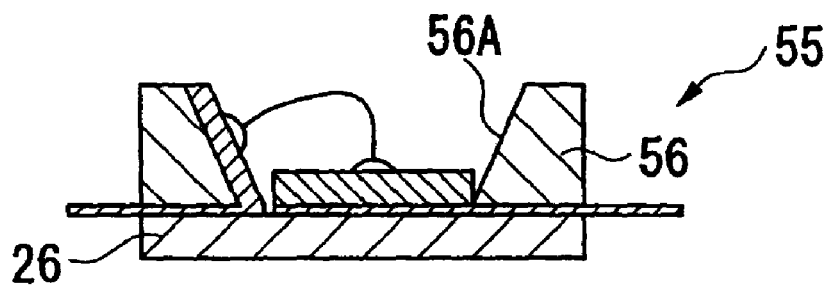
FIG. 7A is a cross-sectional view depicting a main part of a light emitting device according to a third embodiment of the present invention.
Figure 7B:
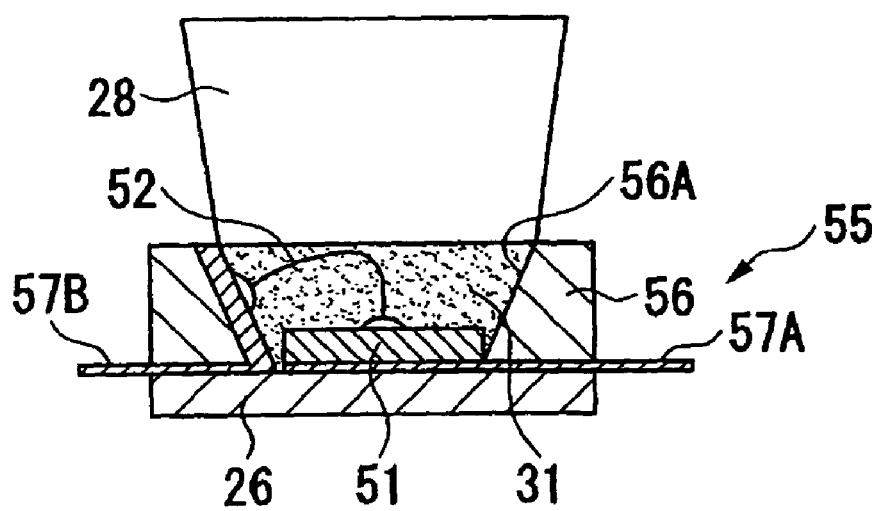
FIG. 7B is a cross-sectional view depicting the light emitting device according to the third embodiment of the present invention.

A third embodiment will now be described with reference to FIGS. 7A and 7B.

The same components as those in the above-described other embodiments are denoted by the same reference numerals, and hence a description thereof will be omitted.

The third embodiment differs from the second embodiment in that, according to a light emitting device 55 of this embodiment, some electrodes 57A and 57B are disposed on part of a mirror surface 56A of a spacer 56, and a connection to an LED 51 using a bonding wire 52 is provided.

According to this light emitting device 55, not only can functions and advantages similar to those described above be achieved but also the LED 51 can be enclosed by four reflection surfaces, as in FIGS. 3A and 3B, even if a bonding wire is required. Because of this, light can be guided onto the tapered rod efficiently. Furthermore, the bonding wire 52 can be shortened.

Figure 8:
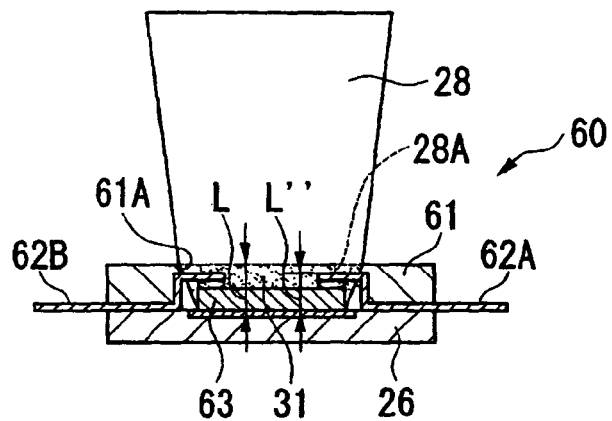
FIG. 8 is a cross-sectional view depicting a light emitting device according to a fourth embodiment of the present invention.

A fourth embodiment will now be described with reference to FIG. 8.

The same components as those in the above-described other embodiments are denoted by the same reference numerals, and hence a description thereof will be omitted.

The fourth embodiment differs from the third embodiment in that, in a light emitting device 60 according to this embodiment, electrodes 62A and 62B are disposed in a spacer 61, an LED 63 is connected directly to a substrate 26 via the electrodes 62A and 62B, and a distance L from a bottom surface 61C of the spacer 61 to a device-side incident surface 28A of a tapered rod 28 is larger than a distance L″ from a top surface 26A of the substrate 26 to the electrodes 62A and 62B.

According to this light emitting device 60, the LED 63 can be enclosed by four reflection surfaces, as in FIGS. 3A and 3B, even if a bonding wire 52 is required, and furthermore, the tapered rod 28 can be brought closer to the LED 63 by reducing the space for the electrodes 62A and 62B in the height direction. Also, this embodiment is compatible with substrates formed of insulators.

Figure 9A:
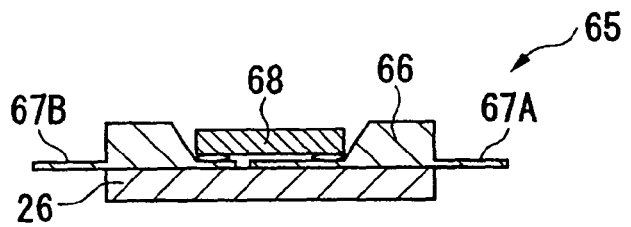
FIG. 9A is a cross-sectional view depicting a main part of a light emitting device according to a fifth embodiment of the present invention.
Figure 9B:
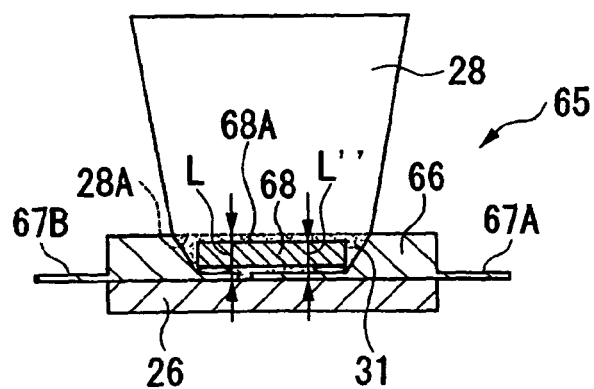
FIG. 9B is a cross-sectional view depicting the light emitting device according to the fifth embodiment of the present invention.

A fifth embodiment will now be described with reference to FIGS. 9A and 9B.

The same components as those in the above-described other embodiments are denoted by the same reference numerals, and hence a description thereof will be omitted.

The fifth embodiment differs from the above-described other embodiments in that, in a light emitting device 65 according to this embodiment, a spacer 66 and electrodes 67A and 67B are integrally formed, the electrodes 67A and 67B are disposed on a surface of an LED 68, i.e., the surface opposite a substrate 26, such that the electrodes 67A and 67B are connected directly to the substrate 26, and a distance L from a bottom surface 66C of the spacer 66 to a device-side incident surface 28A of a tapered rod 28 is substantially equal to a distance L‴ from a top surface 26A of the substrate 26 to a top surface 68A of the LED 68.

If the LED 68 is realized in a flip-chip structure, it is not necessary to provide a space for electrodes adjacent to the top surface 68A of the LED 68, and when supplying a sealing resin 31, it is sufficient to provide only a minimum height of the sealing resin 31 required to cover the LED 68.

Therefore, according to this light emitting device 65, the distance L between the LED 68 and the device-side incident surface 28A of the tapered rod 28 can be minimized, even when the LED 68 is connected to the substrate 26.

A sixth embodiment will now be described with reference to FIGS. 10A to 12.

The same components as those in the above-described other embodiments are denoted by the same reference numerals, and hence a description thereof will be omitted.

Figure 10A:
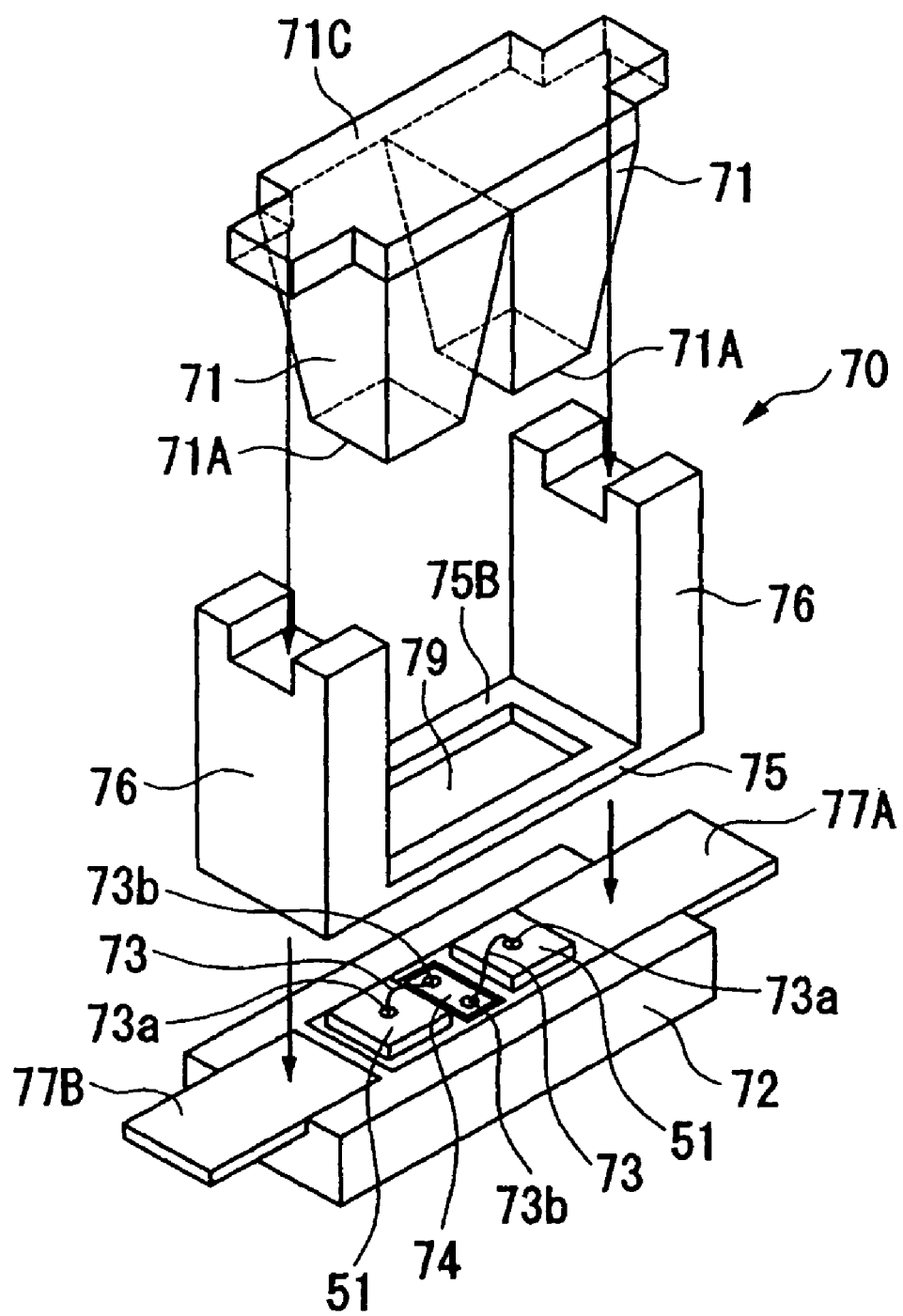
FIG. 10A is a perspective view depicting components to be assembled for a light emitting device according to a sixth embodiment of the present invention.
Figure 10B:
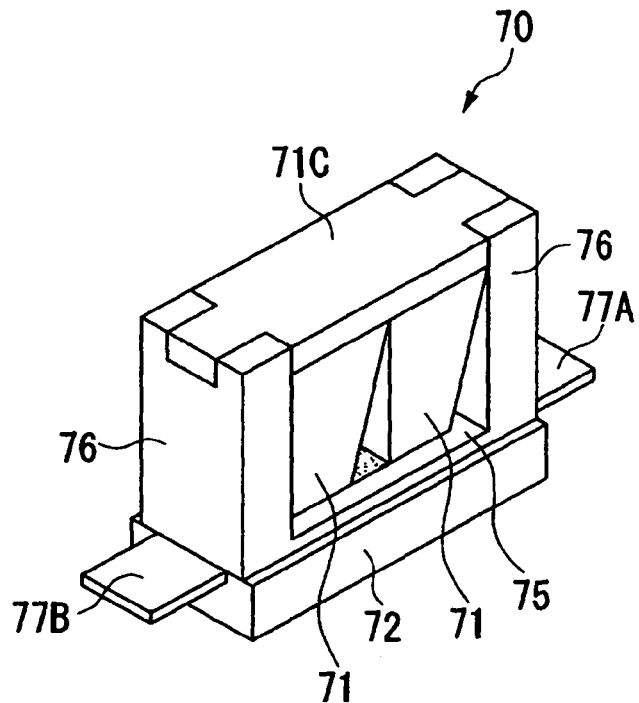
FIG. 10B is a perspective view depicting the light emitting device according to the sixth embodiment of the present invention.
Figure 10C:
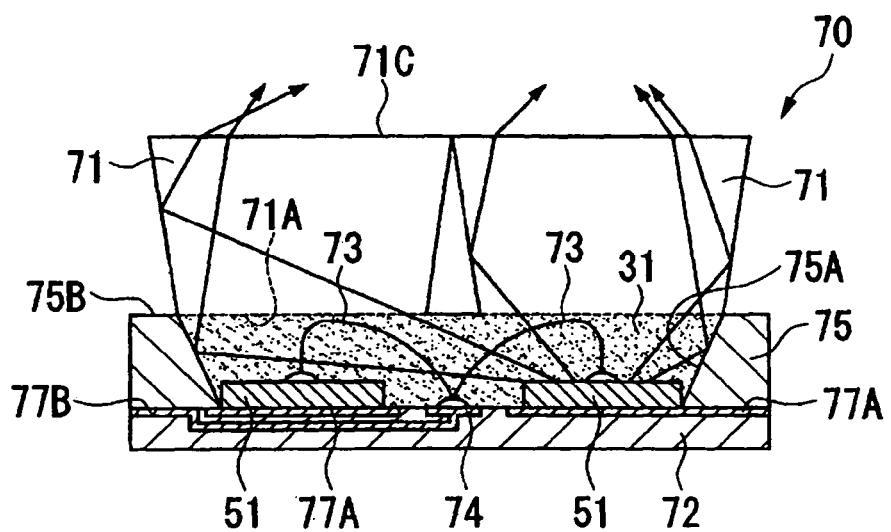
FIG. 10C is a cross-sectional view depicting the light emitting device according to the sixth embodiment of the present invention.

The sixth embodiment differs from the above-described other embodiments in the following points. As shown in FIGS. 10A, 10B, and 10C, a light emitting device 70 according to this embodiment includes two tapered rods 71; two LEDs 51; one pad 74 which is disposed on a substrate 72 and to which one end 73b of a bonding wire 73, whose other end 73a is connected to each of the LEDs 51, is connected; and a rod holding unit 76 which is formed integrally with a spacer 75 to support the two tapered rods 71.

The pad 74 is disposed between the two LEDs 51, and the tapered rods 71 are disposed so as to be aligned with the respective LEDs 51.

Although the device-side incident surfaces 71A of the two tapered rods 71 are separated so as to be aligned with the respective tapered rods 71, a device-side exit surface 71C is formed as a common surface.

A mirror surface 75A of the spacer 75 is formed such that beams emitted from the two LEDs 51 can be incident upon the respective device-side incident surfaces 71A.

The rod holding unit 76 supports the device-side exit surface 71C of the tapered rod 71 and is erected upon a top surface 75B of the spacer 75 to maintain a constant distance between the device-side exit surface 71C of the tapered rods 71 and the top surface 75B of the spacer 75.

An electrode 77A common to the two LEDs 51 is connected to the rear surface of each of the two LEDs 51, which are connected to the pad 74 using the bonding wires 73. As shown in FIG. 10C, the pad 74 is connected to an electrode 77B in the substrate 72.

Figure 11:
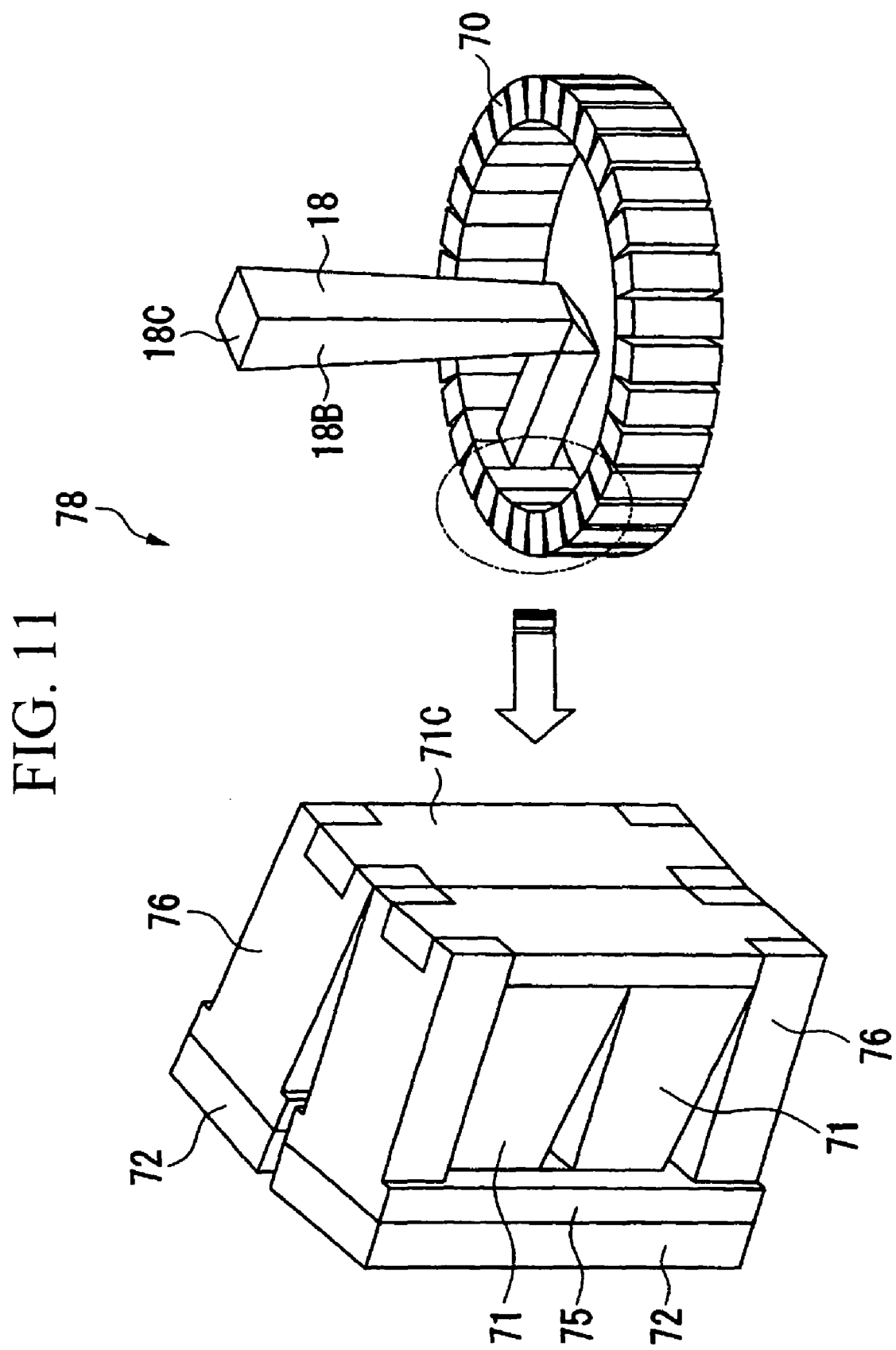
FIG. 11 is a perspective view depicting a main part of an illumination device according to the sixth embodiment of the present invention.

As shown in FIG. 11, in an illumination device 78, light emitting devices 70 are disposed around a circle having its center substantially at one point (intersecting area) where the normals to device-side exit surfaces 71C intersect when the device-side exit surfaces 71C are adjacent to one another. In this case, the two LEDs 51 are arranged in a direction perpendicular to the circumferential direction, that is, the direction in which the light emitting devices 70 are contiguous to one another.

Figure 12:
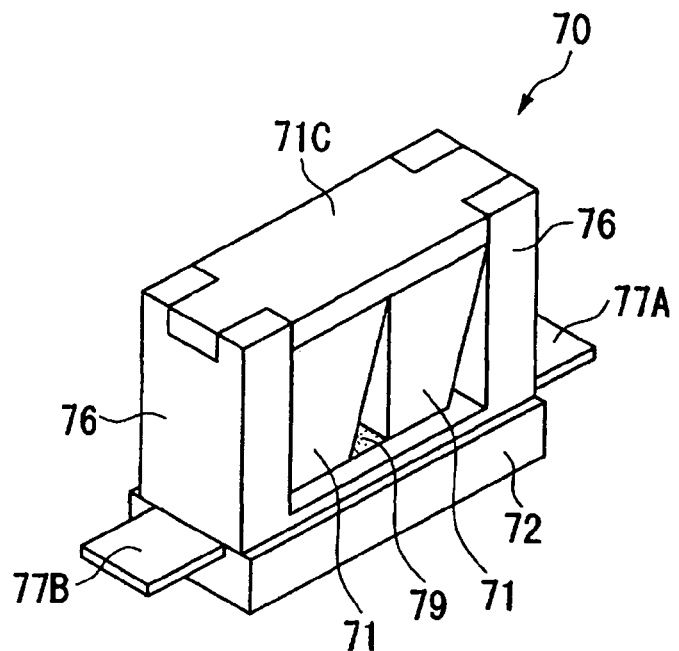
FIG. 12 is a perspective view depicting the light emitting device according to the sixth embodiment of the present invention.

When the light emitting device 70 is manufactured, a sealing resin 31 is supplied to an opening 79 at the position where the pad 74 is disposed, as shown in FIG. 12.

This light emitting device 70 can also afford the same advantages through the same operating procedure and function as in the above-described embodiment.

When the two LEDs 51 are to be connected using the bonding wires 73, areas that cannot cover the neighborhood of the LEDs 51 due to the spacer 75 can be made common by connecting the bonding wires 73 in directions opposite each other. This prevents the luminous efficiency from decreasing.

Therefore, one electrode of one LED 51 and one electrode of the other LED 51 can be formed in common with the pad 74 to reduce the area for the substrate 72. Because of this, the size of the substrate 72 can be reduced. Furthermore, the total number of electrodes in the light emitting device 70 can be reduced.

In addition, each LED 51 can emit illumination light towards the corresponding tapered rod 71 by achieving one-to-one correspondence between the tapered rods 71 and the LEDs 51. This further improves the directivity of each LED 51.

With the rod holding unit 76, the tapered rods 71 can be positioned more stably with respect to the spacer 75.

Furthermore, even if the tapered rods 71 are subjected to thermal expansion, the device-side incident surfaces 71A can be brought into the opening 79 of the spacer 75 without changing the relative positional relationship between the top surface 75B of the spacer 75 and the device-side exit surface 71C because the device-side exit surface 71C is supported. In this manner, thermal expansion of or manufacturing errors in resin making up the spacer 75 and the rod holding unit 76 can be overcome effectively.

In addition, according to this illumination device 78, since the device-side exit surface 71C is smaller, the size of the illumination device 78 can be reduced when the light emitting devices 70 are disposed in a circular shape, as shown in FIG. 2.

Since the exit surface 71C of the light emitting device 70 and the substrate 72 are apart, the area of the substrates 72, corresponding to the outer circumference of the circle, can be made wider than the area of the exit surfaces 71C, corresponding to the inner circumference of the circle. This ensures a sufficient heat radiating surface even though the size is small.

Figure 13:
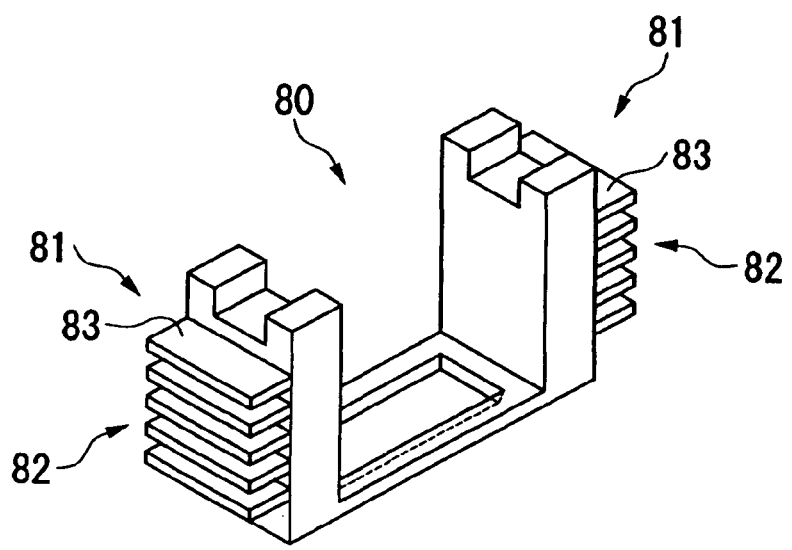
FIG. 13 is a perspective view depicting a rod support unit of a light emitting device according to a seventh embodiment of the present invention.

A seventh embodiment will now be described with reference to FIG. 13.

The same components as those in the above-described other embodiments are denoted by the same reference numerals, and hence a description thereof will be omitted.

The seventh embodiment differs from the above-described sixth embodiment in that a rod holding unit 81 of a light emitting device 80 according to this embodiment includes heat radiators 82 for dissipating heat generated by LEDs.

The heat radiators 82 include a plurality of heat radiating fins 83 protruding towards the outside of the rod support unit 81.

According to this light emitting device 80, functions and advantages similar to those in the above-described sixth embodiment can be offered. In addition, the heat radiators 82 allow heat generated by the LEDs to be dissipated not only via the substrate side but also via the rod holding unit 81 side, thus enabling illumination light to be emitted more stably.

Figure 14:
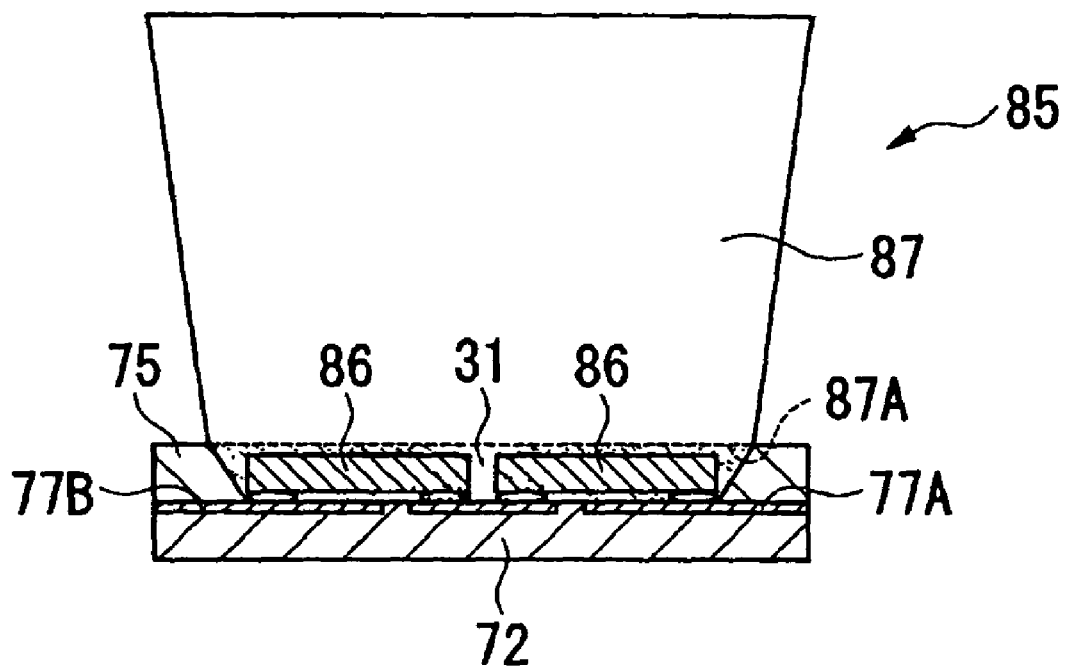
FIG. 14 is a cross-sectional view depicting a light emitting device according to an eighth embodiment of the present invention.

An eighth embodiment will now be described with reference to FIG. 14.

The same components as those in the above-described other embodiments are denoted by the same reference numerals, and hence a description thereof will be omitted.

The eighth embodiment differs from the above-described embodiments in that a light emitting device 85 according to this embodiment includes one tapered rod 87 for two LEDs 86.

In other words, the two LEDs 86 are disposed to face one device-side incident surface 87A.

According to this light emitting device 85, the same advantages as those in the above-described sixth embodiment can be achieved to afford the same effect by guiding light emitted from the two LEDs 86 onto one device-side incident surface 87A.

In this case, a smaller number of tapered rods than that in the above-described sixth embodiment is sufficient. That is, the light emitting device 85 can be manufactured at lower cost.

A ninth embodiment will now be described with reference to FIG. 15A to FIG. 18.

The same components as those in the above-described other embodiments are denoted by the same reference numerals, and hence a description thereof will be omitted.

Figure 15A:
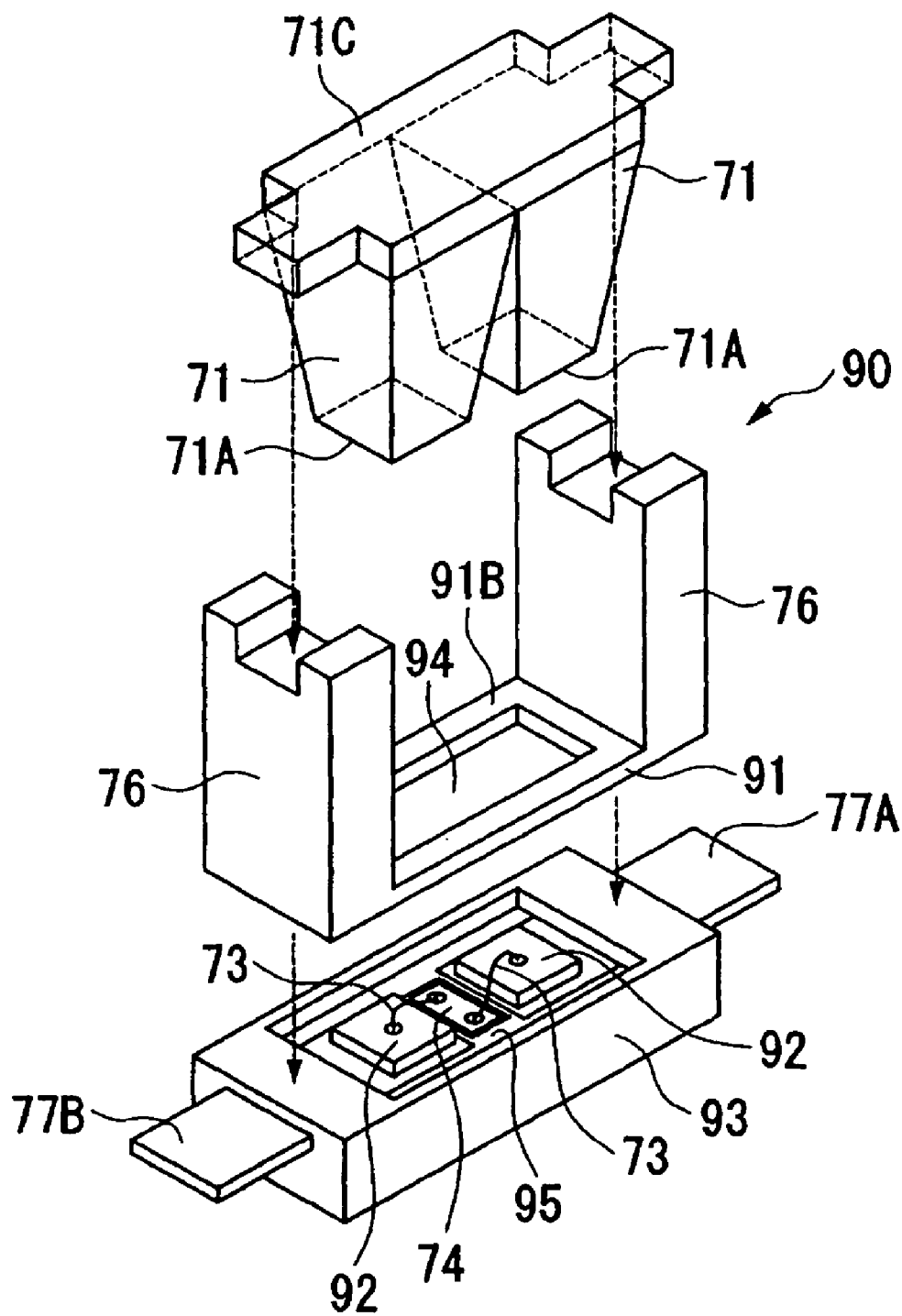
FIG. 15A is a perspective view depicting components to be assembled for a light emitting device according to a ninth embodiment of the present invention.
Figure 15B:
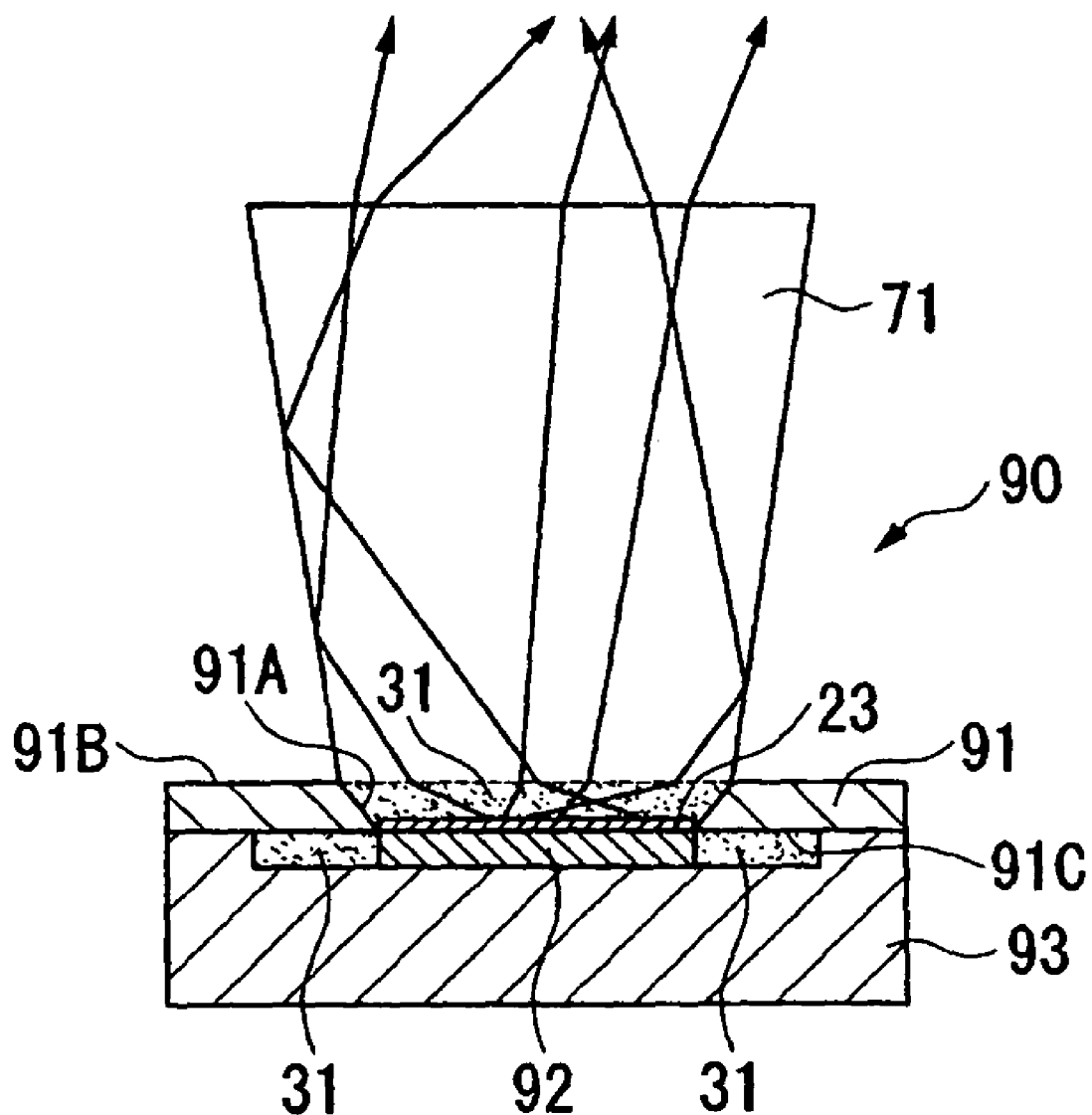
FIG. 15B is a cross-sectional view depicting the light emitting device according to the ninth embodiment of the present invention.

The ninth embodiment differs from the above-described sixth embodiment in the following points. That is, as shown in FIGS. 15A and 15B, the position of a mirror surface 91A at a bottom surface 91C of a spacer 91 of a light emitting device 90 according to this embodiment is substantially equal to the positions of light emitting units 23 of LEDs 92 closest to the substrate 93 in the depth direction of an opening 94 from a top surface 91B of the spacer 91, and the LEDs 92 are positioned with respect to the bottom surface 91C of the spacer 91.

The substrate 93 has an indentation 95 for accommodating the LEDs 92. The indentation 95 has a depth appropriately satisfying the above-described relationship.

The LEDs are classified by structure roughly into the following three types.

Figure 16A:
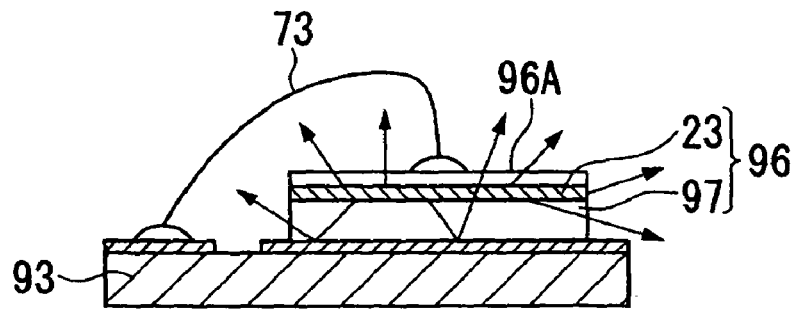
FIG. 16A illustrates wire bonding between a specific type of LED and a substrate.
Figure 16B:
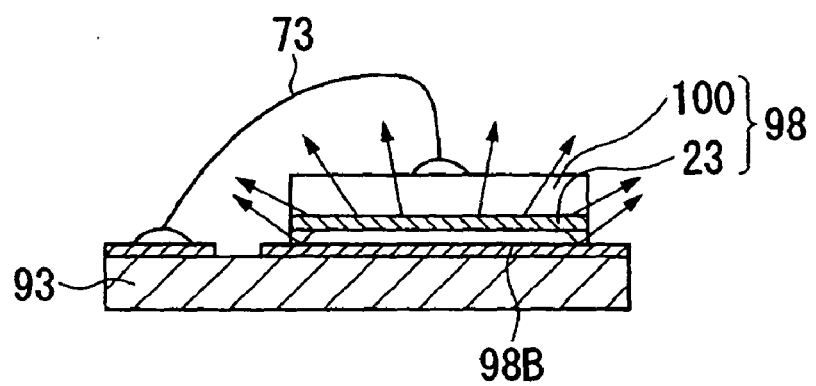
FIG. 16B illustrates wire bonding between a specific type of LED and a substrate.
Figure 16C:
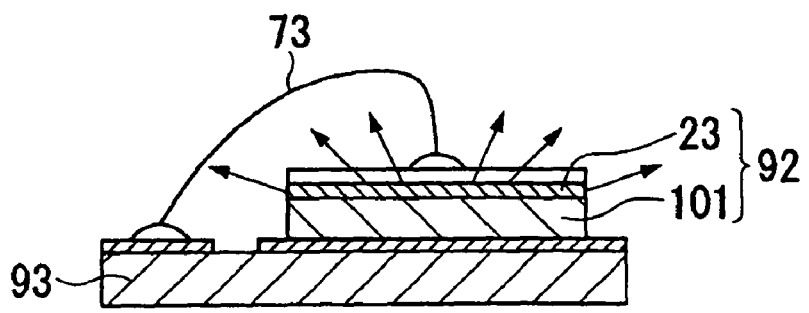
FIG. 16C illustrates wire bonding between a specific type of LED and a substrate.

A first type includes LEDs as shown in FIG. 16A, where the light emitting unit 23 is disposed adjacent to a top surface 96A of an LED 96, and an LED substrate 97 of the LED 96 itself transmits light. A second type includes LEDs as shown in FIG. 16B, where the light emitting unit 23 is disposed adjacent to a bottom surface 98B of an LED 98, and an LED substrate 100 transmits light. A third type includes LEDs as shown in FIG. 16C, where the light emitting unit 23 is disposed adjacent to a top surface 92A of the LED 92, and a reflection surface is formed on the lower surface of the light emitting unit 23 or an LED substrate 101 absorbs light.

For the LEDs 96 and 98, light is emitted from the entire LED, and the bottom surface 91C of the spacer 91 needs to be positioned with respect to the substrate 93. However, the LED 92 is not limited to those positioned as described above. Instead, the lower end of the mirror surface 91A can be aligned with the bottom surface 23A of the light emitting unit 23. Therefore, the light emitting device 90 according to this embodiment is compatible with such an LED 92.

Figure 17:
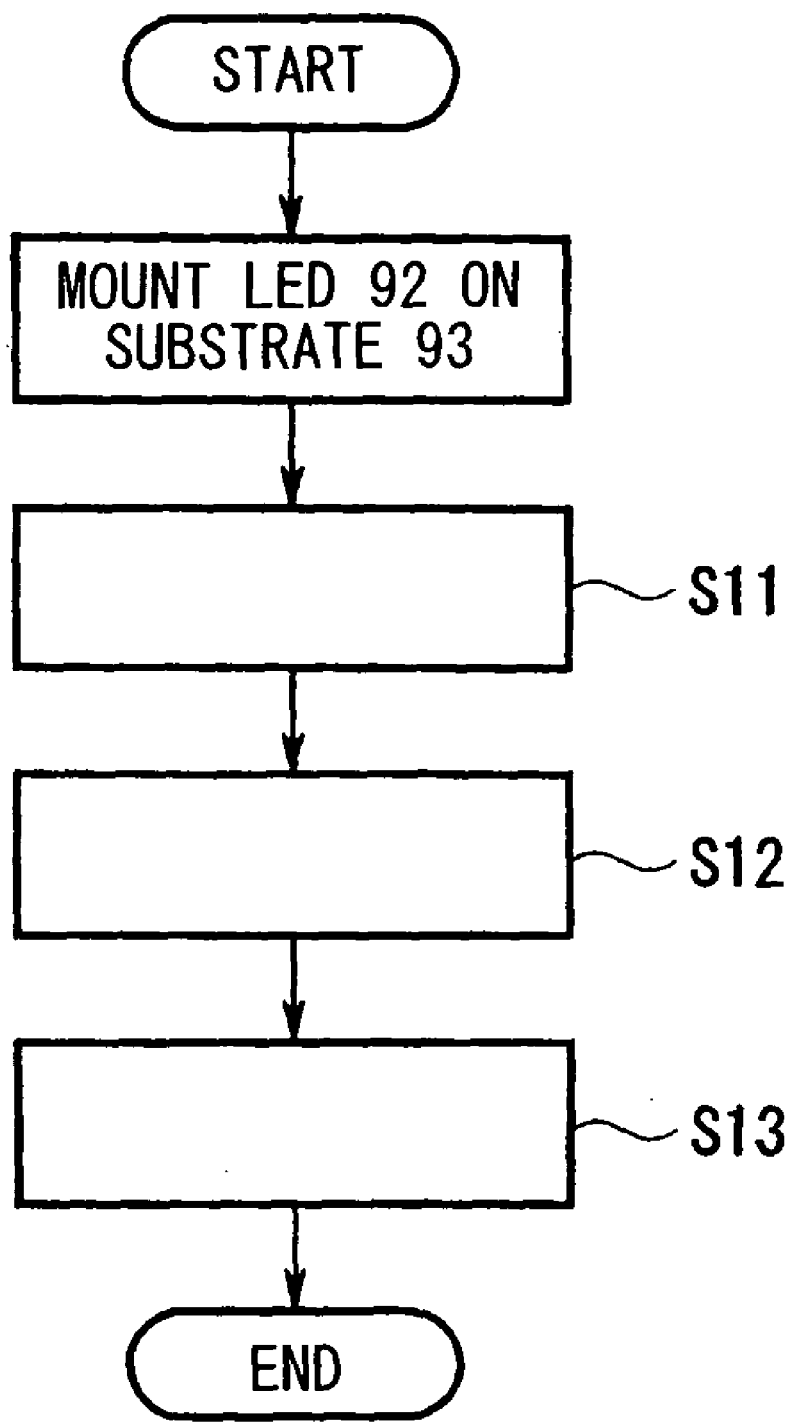
FIG. 17 is a flowchart illustrating a manufacturing method for the light emitting device according to the ninth embodiment of the present invention.

As shown in FIG. 17, a manufacturing method for this light emitting device 90 includes: a first step of mounting the LEDs 92 on the substrate 93 followed by positioning the bottom surface 91C of the spacer 91 with respect to the substrate 93 (S11); a second step of filling the opening 94 having its bottom surface enclosed by the substrate 93 with the sealing resin 31 (S12); and a third step of moving the device-side incident surfaces 71A of the tapered rods 71 to the open area of the top surface 91B of the spacer 91 for positioning such that no air space remains on the device-side incident surfaces 71A and the sealing resin 31 does not adhere to tapered-rod side surfaces 71B functioning as the total reflection surfaces of the tapered rods 71 (S13).

In other words, in this embodiment, the second step and the third step in the first embodiment are swapped.

Figure 18:
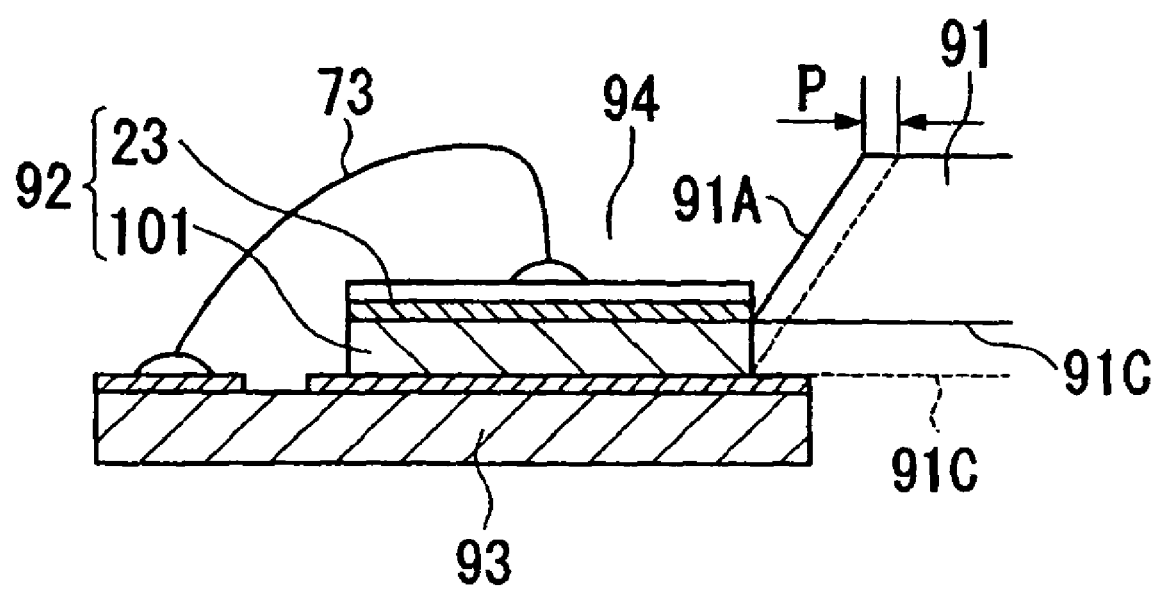
FIG. 18 illustrates an advantage of the light emitting device according to the ninth embodiment of the present invention.

As shown in FIG. 18, according to this light emitting device 90, with the same slope of the mirror surface 91A as that in the other embodiments described above, the opening 94 on the top surface 91B of the spacer 91 can be made smaller (by an amount equivalent to a distance p on one side, as shown in FIG. 18) in the case where the bottom surface 91C of the spacer 91 is below the lower surface of the light emitting unit 23 of the LED 92 (as indicated by a solid line) than in the case where the bottom surface 91C on the spacer 91 is below the lower surface of the LED 92 (as indicated by dotted lines). Consequently, the area of the incident surface 28A of the tapered rod 28 can be reduced, and therefore, the directivity of light emitted from the exit surface 28C of the tapered rod 28 can be improved.

Furthermore, since the inside dimension of the opening enclosed by the mirror surface 91A in the direction of the spacer top surface 91B increases from the substrate 93 towards the tapered rods 71, when the LEDs 92 are positioned on the substrate 93 with respect to the opening 94 and the bottom surface 91C of the spacer 91, illumination light emitted from the LEDs 92 can be efficiently reflected at the mirror surface 91A of the spacer 91 onto the device-side incident surface 71A while preventing the illumination light from leaking through the tapered rods 71. At this time, only the light emitting unit 23 can be disposed in the mirror surface 91A, and therefore, illumination light can be guided onto the device-side incident surface 91A more efficiently.

The technical scope according to the present invention is not limited to the above-described embodiments. Various modifications are conceivable without departing from the spirit and scope of the present invention.

For example, although the opening is provided on the spacer in the above-described embodiments, instead of the opening, an indentation having an open area may be provided on the top surface of the spacer and an LED is placed in the indentation.

Furthermore, although in FIG. 15B the device-side incident surface 71A of the tapered rod 71 and the top surface 91B of the spacer 91 are located on the same flat surface, the device-side incident surface 71A may be positioned slightly below the flat surface into the opening 94. By doing so, the air can be prevented from entering more reliably regardless of possible large manufacturing tolerances (e.g., large variations in the amount of the sealing resin 31 supplied, the size of the tapered rod 71, etc.).

Figure 19A:
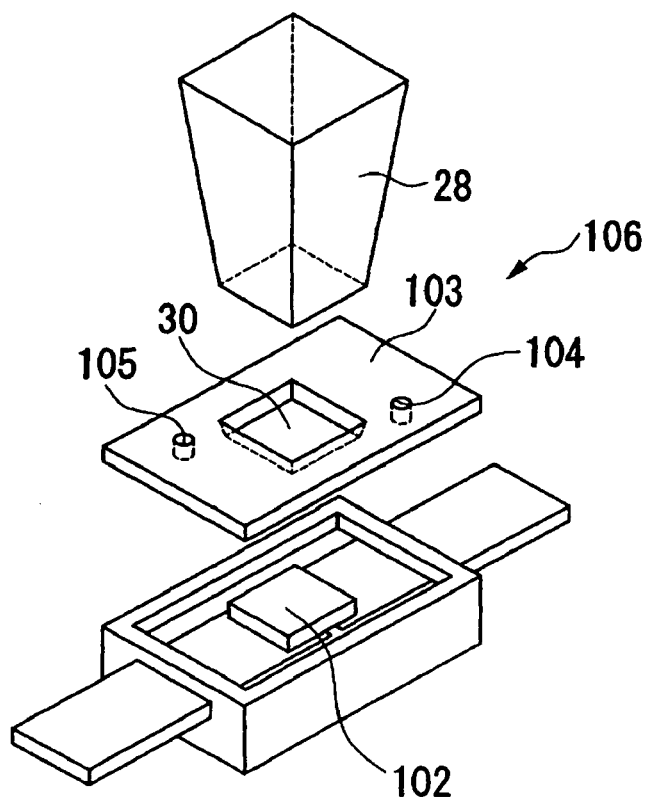
FIG. 19A is a perspective view depicting components to be assembled for a light emitting device according to another embodiment of the present invention.
Figure 19B:
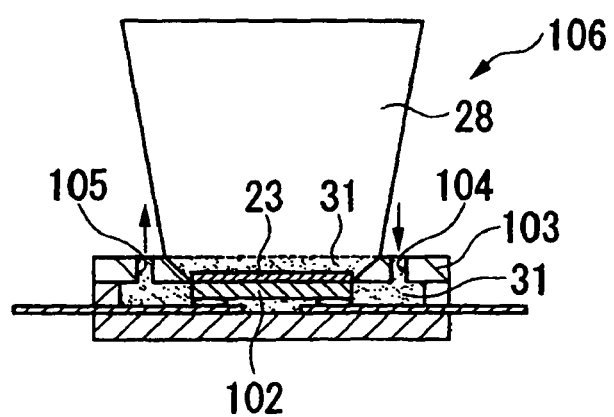
FIG. 19B is a cross-sectional view depicting a light emitting device according to another embodiment of the present invention.

In addition, if one tapered rod 28 is provided for an LED 102 having on the top surface thereof a light emitting part 23, as shown in FIGS. 19A and 19B, a resin inlet 104 through which a sealing resin 31 is supplied and a resin outlet 105 through which the sealing resin 31 is expelled may be provided on a spacer 103.

In the case of this manufacturing method, the sealing resin 31 is poured through the resin inlet 104 until the sealing resin 31 spills from the resin outlet 105 in the second step (S12) following the first step (S11). When the tapered rod 28 is to be positioned in the subsequent third step (S13), the resin is further expelled from the resin outlet 105 for positioning.

According to the manufacturing method for this light emitting device 106, inflow and outflow channels for resin are provided, and therefore, the air is further prevented from remaining. Not only can positioning be performed accurately but also the air can be prevented from flowing between the tapered rod 28 and the LED 102.

Figure 20:
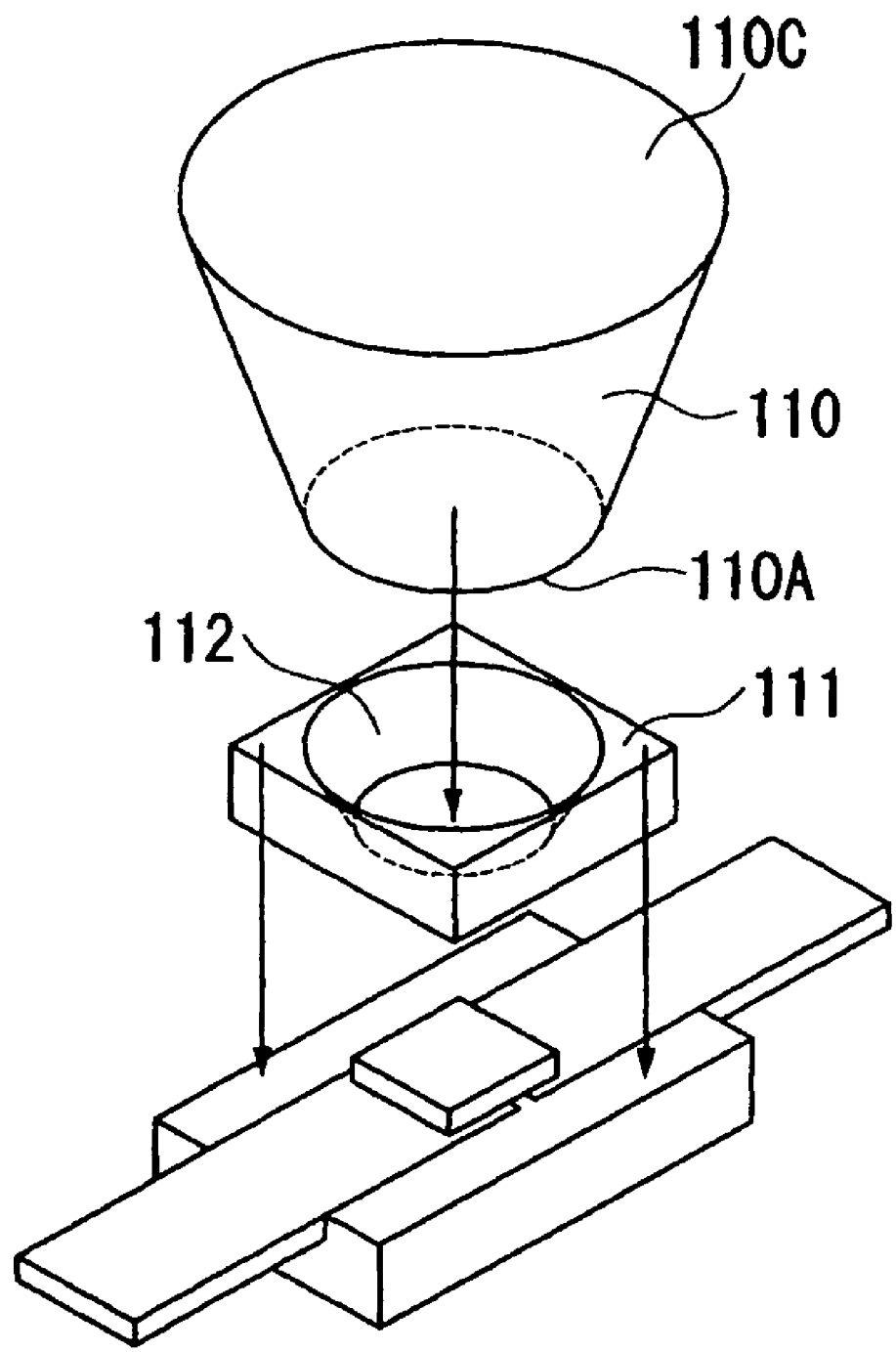
FIG. 20 is a perspective view depicting a light emitting device according to another embodiment of the present invention.

Furthermore, as shown in FIG. 20, a conical tapered rod 110 having a circular device-side incident surface 110A and a circular device-side exit surface 110C. is also acceptable. If this is the case, an opening 112 of a spacer 111 is also conical.

Figure 21:
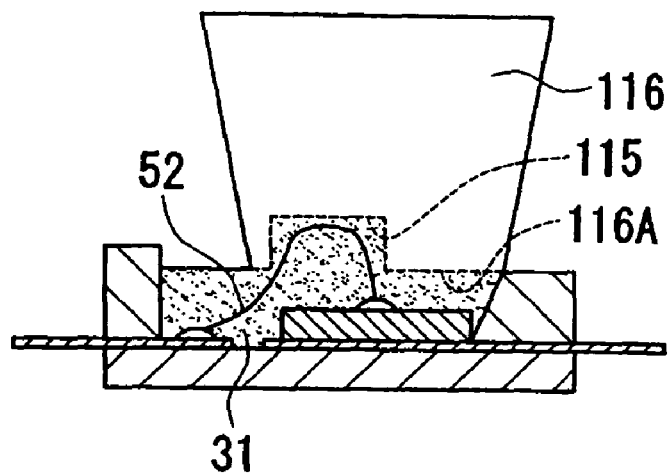
FIG. 21 is a cross-sectional view depicting a light emitting device according to another embodiment of the present invention.

In addition, instead of the device-side incident surface formed as a flat surface, a tapered rod 116 may include a device-side incident surface 116A having an indentation 115 formed on part thereof, as shown in FIG. 21. If this the case, assembling may be carried out, for example, with the bonding wire 52 partially accommodated in the indentation 115 when the bonding wire 52 is connected.

Figure 22:
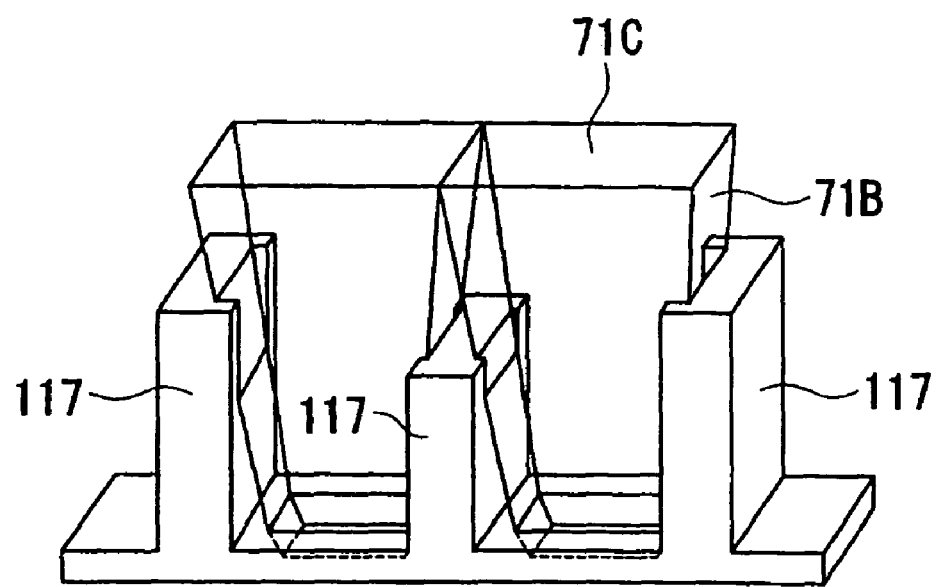
FIG. 22 is a perspective view depicting a light emitting device according to another embodiment of the present invention.

Furthermore, as shown in FIG. 22, rod support units 117 may support the tapered-rod side surfaces 71B adjacent to a device-side exit surface 71C.

Figure 23:
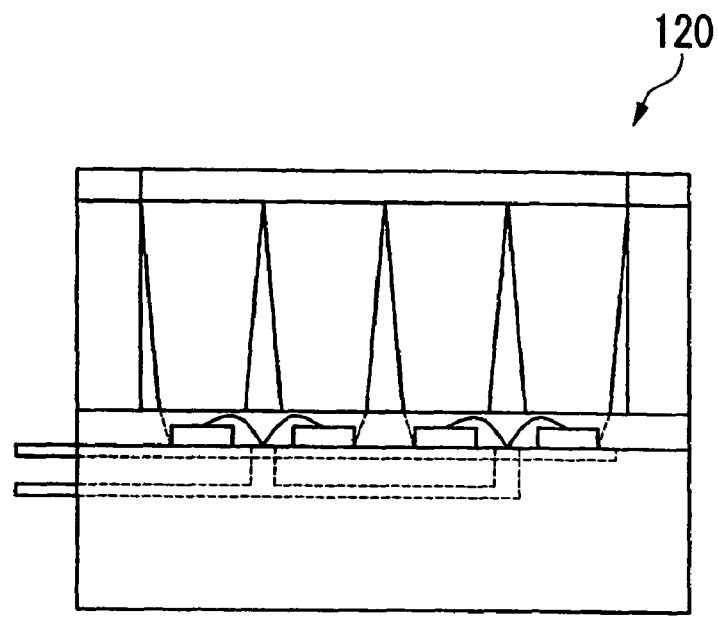
FIG. 23 is a cross-sectional view depicting a light emitting device according to another embodiment of the present invention.

In addition, the number of spacers and the numbers of tapered rods and LEDs provided on the substrate are not limited to one or two. As shown in FIG. 23, a light emitting device 120 having three or more spacers, tapered rods, and LEDs arranged in parallel is also acceptable.

Furthermore, although the lower part of the spacer has been illustrated to be in contact with the LED, it need not be only this structure. A high-efficiency light emitting device can also be produced by bringing the spacer as close to the LED as possible during manufacturing.

Figure 24A:
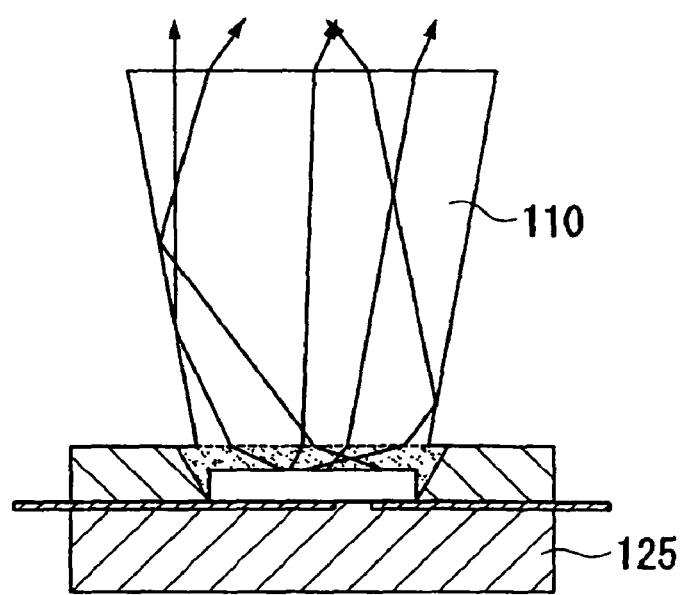
FIG. 24A is a cross-sectional view depicting a light emitting device according to another embodiment of the present invention.
Figure 24B:
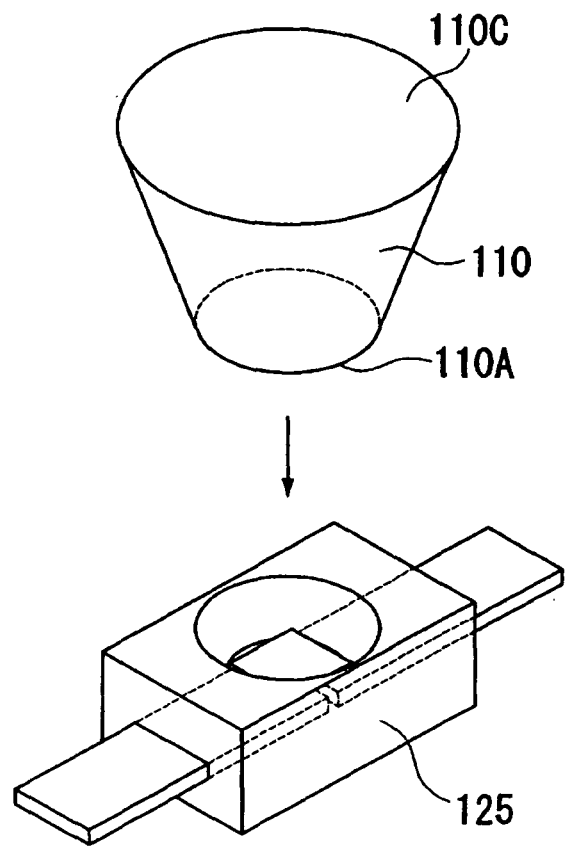
FIG. 24B is a perspective view depicting a light emitting device according to another embodiment of the present invention.
Figure 25:
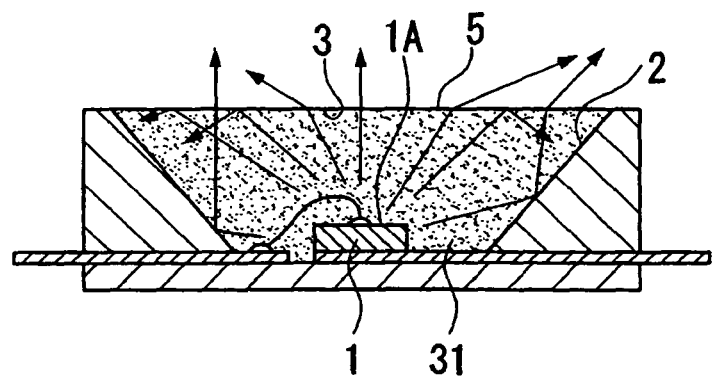
FIG. 25 is a cross-sectional view depicting a known light emitting device.

In addition, as shown in FIGS. 24A and 24B, a structure that satisfies the condition "n1>m1>n2>m2" is also acceptable, where m1 represents the area of the opening at the top surface, m2 represents the bottom surface area in the indentation of the spacer or the area of the opening at the bottom surface, n1 represents the area of the tapered rod exit surface, and n2 represents the area of the tapered rod incident surface. With the above-described condition, a ray in the inner (narrow exit angle) region of a beam emitted from the LED can be guided onto the tapered rod incident surface, compared with the condition "n1>m1≧n2>m2" in FIGS. 3A and 3B. In addition, the area of the tapered rod incident surface can be reduced compared with the condition "n1>m1≧n2>m2" in FIGS. 3A and 3B. Consequently, the area ratio between the incident end and the exit end can be increased, and hence, the directivity of light emitted from the tapered rod exit surface can further be increased. This is useful in the case where a modulating element, such as an LCD, which requires a restricted illumination light incident angle is to be illuminated.

Furthermore, the spacer and the substrate may be realized by a spacer 125 integrally formed so as to enclose the electrode, as shown in FIGS. 24A and 24B. Through integration as described above, the number of components can be reduced, and thus, production becomes easier.

According to this light emitting device, the area of the mirror surface increases from the substrate towards the columnar light guide unit. When the light emitting element is positioned on the substrate with respect to the bottom surface of the indentation or the opening and the bottom surface of the spacer, this structure of the mirror surface allows illumination light emitted from the light emitting element to be guided onto the incident surface by efficiently reflecting the illumination light at the mirror surface of the spacer and more effectively preventing loss of light entering the columnar light guide unit.

In addition, if the light emitting unit is disposed adjacent to the spacer when the light emitting element is mounted on the substrate, only the light emitting unit, rather than the entire light emitting element, can be disposed in the mirror surface. Therefore, illumination light can be guided onto the incident surface of the columnar light guide unit more efficiently.

The light emitting device according to the present invention is the above-described light emitting device wherein the incident surface of the at least one columnar light guide unit and the spacer top surface are located substantially at an identical position.

This light emitting device can prevent illumination light from leaking between the incident surface of the columnar light guide unit and the spacer top surface.

The light emitting device according to the present invention is the above-described light emitting device wherein the incident surface of the at least one columnar light guide unit is disposed in the indentation or the opening, an edge of the incident surface being in contact with the mirror surface.

According to this light emitting device, a gap can be prevented from occurring at a boundary between the incident surface of the columnar light guide unit and the mirror surface, regardless of thermal expansion of or manufacturing errors in resin making up the columnar light guide unit or the spacer.

The light emitting device according to the present invention is the above-described light emitting device wherein the indentation or the opening is filled with a transparent member having a refractive index smaller than that of the columnar light guide unit, and at least the light emitting unit of the light emitting element is shielded from the air by the transparent member.

When illumination light is incident upon the incident surface of the columnar light guide unit, this light emitting device can guide the illumination light into the columnar light guide unit while preventing the light from being reflected by the air to reduce loss of the light reflected at the mirror surface.

The light emitting device according to the present invention is the above-described light emitting device wherein the light emitting element is connected to the substrate with a bonding wire, and a distance from the bottom surface of the indentation or the bottom surface of the spacer to the incident surface of the columnar light guide unit is substantially equal to a distance from the top surface of the substrate to a most distant position of the bonding wire.

According to this light emitting device, when the light emitting element is to be connected to the substrate with a bonding wire, the columnar light guide unit can be positioned while a space for mounting the bonding wire is allocated.

The light emitting device according to the present invention is the above-described light emitting device wherein an electrode is disposed on a face of the light emitting element, the face being opposite the substrate; the electrode is connected directly to the substrate; and a distance from the bottom surface of the indentation or the bottom surface of the spacer to the incident surface of the columnar light guide unit is substantially equal to a distance from the top surface of the substrate to the top surface of the light emitting element.

For a light emitting element that requires no space for electrodes on the top surface thereof, this light emitting device can minimize the distance between the light emitting element and the incident surface of the columnar light guide unit by connecting the light emitting element and the substrate with a wire to guide more light through total reflection.

The light emitting device according to the present invention is the above-described light emitting device wherein an electrode is disposed on the spacer, the light emitting element is connected directly to the substrate via the electrode, and a distance from the bottom surface of the indentation or the bottom surface of the spacer to the incident surface of the columnar light guide unit is larger than a distance from the top surface of the substrate to the electrode.

This light emitting device allows all sides of the light emitting element to face the mirror surface. Therefore, even more light can be guided into the columnar light guide unit.

The light emitting device according to the present invention is the above-described light emitting device wherein the condition $n1>n2 \geqq m1>m2$ is satisfied, where $m1$ represents the area of the opening on the top surface of the spacer at the indentation or the opening, $m2$ represents the bottom surface area of the indentation or the area of the opening at the bottom surface of the spacer, $n1$ represents an area of the exit surface of the columnar light guide unit, and $n2$ represents an area of the incident surface of the columnar light guide unit.

The light emitting device according to the present invention is the above-described light emitting device wherein the condition $n1>m1>n2>m2$ is satisfied, where $m1$ represents the area of the opening on the top surface of the spacer at the indentation or the opening, $m2$ represents the bottom surface area of the indentation or the area of the opening at the bottom surface of the spacer, $n1$ represents an area of the exit surface of the columnar light guide unit, and $n2$ represents an area of the incident surface of the columnar light guide unit.

The light emitting device according to the present invention is the above-described light emitting device wherein an inside dimension of the indentation or the opening enclosed by the mirror surface along a direction of the spacer top surface becomes gradually larger from the spacer bottom surface towards the spacer top surface, and an inside dimension of the columnar light guide unit enclosed by the total reflection surface along a direction of the incident surface becomes gradually larger from the incident surface towards the exit surface.

In all cases, this light emitting device can guide illumination light from a light emitting element having a wide emission angle while changing the incident angle in accordance with the desired directivity, thus improving the directivity more effectively.

The light emitting device according to the present invention is the above-described light emitting device wherein the light emitting element includes two light emitting elements, one end of a bonding wire is connected to each of the two light emitting elements, and the other end of the bonding wire is connected to one pad provided on the substrate.

In the case where two light emitting elements are provided, this light emitting device can use a common electrode for the two light emitting elements. Therefore, the substrate area can be reduced more than in the case where two LEDs are simply arranged side by side. Furthermore, the total number of electrodes in the light emitting device can be reduced.

The light emitting device according to the present invention is the above-described light emitting device wherein the pad is provided between the two light emitting elements.

According to this light emitting device, when the two light emitting elements are to be connected using the bonding wires, areas that cannot cover the neighborhood of the light emitting elements due to the spacer can be made common by connecting the bonding wires in the directions opposite each other. This prevents the luminous efficiency from decreasing.

The light emitting device according to the present invention is the above-described light emitting device wherein the columnar light guide unit includes two columnar light guide units, corresponding to the light emitting elements, respectively.

In this light emitting device, each light emitting element is disposed to face one corresponding columnar light guide unit to cause the light emitting elements to emit illumination light individually. This further increases the directivity of the light emitting elements.

The light emitting device according to the present invention is the above-described light emitting device wherein the columnar light guide unit includes one columnar light guide unit, corresponding to the two light emitting elements.

This light emitting device can be manufactured at lower cost without increasing the number of columnar light guide units.

The light emitting device according to the present invention is the above-described light emitting device including a rod holding unit formed integrally with the spacer to support the at least one columnar light guide unit.

This light emitting device allows the columnar light guide unit to be positioned more stably with respect to the spacer.

The light emitting device according to the present invention is the above-described light emitting device wherein the rod holding unit maintains a constant distance between the exit surface of the at least one columnar light guide unit and the spacer top surface.

The light emitting device according to the present invention is the above-described light emitting device wherein the rod holding unit supports the at least one columnar light guide unit by the exit surface.

According to this light emitting device, even if the columnar light guide unit is subjected to thermal expansion, the incident surface of the columnar light guide unit can be brought into the indentation or the opening of the spacer without changing the relative positional relationship between the spacer top surface and the exit surface. In this manner, thermal expansion of or manufacturing errors in the constituent resin can be overcome effectively.

The light emitting device according to the present invention is the above-described light emitting device wherein the rod holding unit includes a heat radiator for dissipating heat generated by the light emitting element.

According to this light emitting device, heat can be dissipated not only via the substrate side but also via the rod holding unit side, thus enabling illumination light to be emitted more stably.

An illumination device according to the present invention includes a plurality of the light emitting devices according to the present invention, wherein the light emitting devices are disposed around a circle having a center thereof in an intersecting area of a certain size such that normals to the exit surfaces of the columnar light guide units intersect in the intersecting area.

According to this illumination device provided with the light emitting devices according to the present invention, illumination light with high directivity can be emitted from the exit surfaces of the plurality of columnar light guide units to collect a large amount of light in the intersecting area.

An illumination device according to the present invention includes a plurality of the light emitting devices according to the present invention, wherein the light emitting devices are disposed around a circle having a center thereof in an intersecting area of a certain size such that normals to the exit surfaces of the columnar light guide units intersect in the intersecting area, the exit surfaces being adjacent to one another, and the two light emitting elements are disposed side by side in a direction perpendicular to the circumference.

This illumination device can be made small when the light emitting devices are disposed around a circle because the exit surfaces of the light emitting devices included in this illumination device are small. In addition, since the exit surfaces of the light emitting devices are away from the substrates, areas for the substrates can be allocated. This ensures that a heat radiating surface is allocated regardless of the reduced size.

According to this illumination device, regardless of an orientation characteristic in the light emitting elements of the light emitting devices, light can be focused onto the light-collecting unit with less non-uniform illumination by controlling a variation in the amount of illumination light of the light emitting devices to within a certain range with the light-emitting-device control unit. This ensures that the illuminated area is illuminated with a stable amount of light.

A projector according to the present invention includes the illumination device according to the present invention; a spatial modulating element for modulating illumination light emitted by the illumination device according to input image information; and a projection optical unit for projecting the illumination light modulated by the spatial modulating element onto a screen.

According to this projector, an illumination optical system (e.g., a Koehler illumination optical system) having the exit surfaces of the columnar light guide units as a virtual light source can be realized such that the amount of light loss from the light emitting elements is minimized to focus onto a screen an optical image generated by modulating this illumination light with a uniform luminance distribution by a spatial modulating unit.

A manufacturing method for the light emitting device according to the present invention is a manufacturing method for the light emitting device according to the present invention. The method includes a first step of positioning the bottom surface of the indentation of the spacer or the bottom surface of the spacer with respect to the substrate; a second step of positioning the incident surface of the at least one columnar light guide unit with respect to an open area of the spacer top surface; and a third step of filling the indentation enclosed by the incident surface or the opening enclosed by the substrate and the incident surface with a transparent member having a refractive index smaller than that of the columnar light guide unit such that no air space remains on the incident surface and the transparent member does not adhere to a side face functioning as the total reflection surface of the columnar light guide unit. According to this manufacturing method for the light emitting device, since the transparent member is supplied only after the columnar light guide unit has been positioned, assembly is possible with a sufficient amount of transparent member to efficiently expel the air in the indentation or opening.

A manufacturing method for the light emitting device according to the present invention is a manufacturing method for the light emitting device according to the present invention. The method includes a first step of positioning the bottom surface of the indentation of the spacer or the bottom surface of the spacer with respect to the substrate; a second step of filling the indentation or the opening having a bottom surface thereof enclosed by the substrate with a transparent member having a refractive index smaller than that of the columnar light guide unit; and a third step of moving the incident surface of the at least one columnar light guide unit to an open area of the spacer top surface for positioning such that no air space remains on the incident surface and the transparent member does not adhere to a side face functioning as the total reflection surface of the columnar light guide unit.

According to this manufacturing method for the light emitting device, since the columnar light guide unit is positioned only after the transparent member has been supplied, the optical element and the incident surface can be positioned accurately.

The invention claimed is:

1. A light emitting device comprising:
   at least one light emitting element having a light emitting part for emitting illumination light;
   a substrate to which the light emitting element is fixed;
   a spacer having a mirror surface for reflecting the illumination light emitted from the light emitting element; and
   at least one columnar light guide unit having an incident surface upon which the illumination light is incident, a total reflection surface for totally reflecting the illumination light coming from the incident surface, and an exit surface having an area larger than an area of the incident surface, the exit surface emitting the illumination light totally reflected at the total reflection surface, wherein
   the spacer includes an indentation open at least at a top thereof or an opening,
   the light emitting element is positioned with respect to a bottom surface of the indentation or the opening and a bottom surface of the spacer,
   the mirror surface is formed on the indentation or an inner side surface of the opening,
   the area of the opening at the top surface of the spacer is larger than a bottom surface area of the indentation or the area of the opening at the bottom surface of the spacer,
   the incident surface of the at least one columnar light guide unit is located in the indentation or on the spacer top surface at the opening, the indentation or the opening is filled with a transparent member, at least the light emitting unit of the light emitting element is shielded from air by the transparent member, and there is no air space between the incident surface and the transparent member, and
   the condition $n1>m1>n2>m2$ is satisfied, where $m1$ represents the area of the opening on the top surface of the spacer at the indentation or the opening,
   $m2$ represents the bottom surface area of the indentation or the area of the opening at the bottom surface of the spacer,
   $n1$ represents the area of the exit surface of the columnar light guide unit, and
   $n2$ represents the area of the incident surface of the columnar light guide unit.

2. The light emitting device according to claim 1, wherein the incident surface of the at least one columnar light guide unit and the spacer top surface are located substantially at an identical position.

3. The light emitting device according to claim 1, wherein the incident surface of the at least one columnar light guide unit is disposed in the indentation or the opening, an edge of the incident surface being in contact with the mirror surface.

4. The light emitting device according to claim 1, wherein the refractive index of the transparent member is smaller than that of the columnar light guide unit.

5. The light emitting device according to claim 1, wherein the light emitting element is connected to the substrate with a bonding wire, and
   a distance from the bottom surface of the indentation or the bottom surface of the spacer to the incident surface of the columnar light guide unit is substantially equal to a distance from the top surface of the substrate to a most distant position of the bonding wire.

6. The light emitting device according to claim 1, wherein an electrode is disposed on a face of the light emitting element, the face being opposite the substrate;
the electrode is connected directly to the substrate; and
a distance from the bottom surface of the indentation or the bottom surface of the spacer to the incident surface of the columnar light guide unit is substantially equal to a distance from the top surface of the substrate to the top surface of the light emitting element.

7. The light emitting device according to claim 1, wherein an electrode is disposed on the spacer,
the light emitting element is connected directly to the substrate via the electrode, and
a distance from the bottom surface of the indentation or the bottom surface of the spacer to the incident surface of the columnar light guide unit is larger than a distance from the top surface of the substrate to the electrode.

8. The light emitting device according to claim 1, wherein said light emitting element includes two light emitting elements,
one end of a bonding wire is connected to each of the two light emitting elements, and the other end of the bonding wire is connected to one pad provided on the substrate.

9. The light emitting device according to claim 8, wherein the pad is provided between the two light emitting elements.

10. The light emitting device according to claim 8, wherein said columnar light guide unit includes two columnar light guide units corresponding to the light emitting elements, respectively.

11. The light emitting device according to claim 8, wherein said columnar light guide unit includes one columnar light guide unit corresponding to the two light emitting elements.

12. The light emitting device according to claim 1, further comprising a rod holding unit formed integrally with the spacer to support the at least one columnar light guide unit.

13. The light emitting device according to claim 12, wherein the rod holding unit maintains a constant distance between the exit surface of the at least one columnar light guide unit and the spacer top surface.

14. The light emitting device according to claim 13, wherein the rod holding unit supports the at least one columnar light guide unit by the exit surface.

15. The light emitting device according to claim 12, wherein the rod holding unit includes a heat radiator for dissipating heat generated by the light emitting element.

16. An illumination device comprising a plurality of the light emitting devices according to claim 1, wherein
the light emitting devices are disposed around a circle having a center thereof in an intersecting area of a certain size such that normals to the exit surfaces of the columnar light guide units intersect in the intersecting area.

17. An illumination device comprising a plurality of the light emitting devices according to claim 1, wherein
the light emitting devices are disposed around a circle having a center thereof in an intersecting area of a certain size such that normals to the exit surfaces of the columnar light guide units intersect in the intersecting area, the exit surfaces being adjacent to one another, and
the two light emitting elements are disposed side by side in a direction perpendicular to the circumference.

18. The illumination device according to claim 16, comprising:

a light-emitting-device control unit for time-sequentially illuminating the light emitting elements for each light emitting device; and
a light-collecting unit for collecting the illumination light from each of the light emitting devices to illuminate an illumination area, wherein
the light-emitting-device control unit controls a variation in the amount of illumination light in the illuminated area to within a certain range.

19. The illumination device according to claim 17, comprising:
a light-emitting-device control unit for time-sequentially illuminating the light emitting elements for each light emitting device; and
a light-collecting unit for collecting the illumination light from each of the light emitting devices to illuminate an illumination area, wherein
the light-emitting-device control unit controls a variation in the amount of illumination light in the illuminated area to within a certain range.

20. A projector including the illumination device according to claim 16 for emitting illumination light according to input image information, comprising:
a spatial modulating element for modulating illumination light emitted by the illumination device according to input image information; and
a projection optical unit for projecting the illumination light modulated by the spatial modulating element onto a screen.

21. A projector including the illumination device according to claim 17 for emitting illumination light according to input image information, comprising:
a spatial modulating element for modulating illumination light emitted by the illumination device according to input image information; and
a projection optical unit for projecting the illumination light modulated by the spatial modulating element onto a screen.

22. A manufacturing method for the light emitting device according to claim 1, comprising:
a first step of positioning the bottom surface of the indentation of the spacer or the bottom surface of the spacer with respect to the substrate;
a second step of positioning the incident surface of the at least one columnar light guide unit with respect to an open area of the spacer top surface; and
a third step of filling the indentation enclosed by the incident surface or the opening enclosed by the substrate and the incident surface with a transparent member having a refractive index smaller than that of the columnar light guide unit such that no air space remains on the incident surface and the transparent member does not adhere to a side face functioning as the total reflection surface of the columnar light guide unit.

23. A manufacturing method for the light emitting device according to claim 1, comprising:
a first step of positioning the bottom surface of the indentation of the spacer or the bottom surface of the spacer with respect to the substrate;
a second step of filling the indentation or the opening having a bottom surface thereof enclosed by the substrate with a transparent member having a refractive index smaller than that of the columnar light guide unit; and
a third step of moving the incident surface of the at least one columnar light guide unit to an open area of the spacer top surface for positioning such that no air space remains on the incident surface and the transparent member does not adhere to a side face functioning as the total reflection surface of the columnar light guide unit.

24. A light emitting device comprising:
at least one light emitting element having a light emitting part for emitting illumination light;
a substrate to which the light emitting element is fixed;
a spacer having a mirror surface for reflecting the illumination light emitted from the light emitting element; and
at least one columnar light guide unit having an incident surface upon which the illumination light is incident, a total reflection surface for totally reflecting the illumination light coming from the incident surface, and an exit surface having an area larger than an area of the incident surface, the exit surface emitting the illumination light totally reflected at the total reflection surface, wherein
the spacer includes an indentation open at least at a top thereof or an opening,
the mirror surface is formed on the indentation or an inner side surface of the opening,
a position of the mirror surface closest to a bottom surface of the spacer is substantially equal to a position of the light emitting unit closest to the substrate in a depth direction of the indentation or the opening from a spacer top surface, and the light emitting element is positioned with respect to the indentation bottom surface of the spacer or the bottom surface of the spacer,
an area of the opening at the top surface of the spacer is larger than a bottom surface area of the indentation or an area of the opening at the bottom surface of the spacer,
the incident surface of the at least one columnar light guide unit is located in the indentation or on the spacer top surface at the opening, the indentation or the opening is filled with a transparent member, at least the light emitting unit of the light emitting element is shielded from air by the transparent member, and there is no air space between the incident surface and the transparent member, and
the condition $n1>m1>n2>m2$ is satisfied, where
$m1$ represents the area of the opening on the top surface of the spacer at the indentation or the opening,
$m2$ represents the bottom surface area of the indentation or the area of the opening at the bottom surface of the spacer,
$n1$ represents the area of the exit surface of the columnar light guide unit,
and $n2$ represents the area of the incident surface of the columnar light guide unit.

* * * * *